US006652662B1

(12) United States Patent
Ishihara et al.

(10) Patent No.: US 6,652,662 B1
(45) Date of Patent: Nov. 25, 2003

(54) SUBSTRATE SURFACE PROCESSING APPARATUS AND METHOD

(75) Inventors: Akira Ishihara, Tosu (JP); Akira Yonemizu, Kumamoto (JP); Takanori Miyazaki, Kumamoto (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/283,920

(22) Filed: Apr. 1, 1999

(30) Foreign Application Priority Data

Apr. 3, 1998 (JP) ............................................ 11-108695
Apr. 3, 1998 (JP) ............................................ 11-108696

(51) Int. Cl.$^7$ ................................................ B08B 3/02
(52) U.S. Cl. ..................... 134/18; 134/24.4; 134/113; 134/104.1; 134/902; 134/56 R
(58) Field of Search ........................... 134/6, 7, 18, 33, 134/56 R, 113, 902, 104.1, 25.4; 15/77, 88.2, 88.3, 102, 97.1

(56) References Cited

U.S. PATENT DOCUMENTS

| 5,475,889 | A | * | 12/1995 | Thrasher et al. | .............. | 15/88.3 |
| 5,636,401 | A | * | 6/1997 | Yonemizu et al. | .............. | 15/77 |
| 5,647,083 | A | * | 7/1997 | Sugimoto et al. | .............. | 15/77 |
| 5,947,134 | A | * | 9/1999 | Kim et al. | ................. | 134/57 R |

FOREIGN PATENT DOCUMENTS

| JP | 08010719 | 1/1996 |
| JP | 8-267023 | 10/1996 |
| JP | 2848783 | 11/1998 |

* cited by examiner

Primary Examiner—Frankie L. Stinson
(74) Attorney, Agent, or Firm—Smith, Gambrell & Russell LLP

(57) ABSTRACT

A processing apparatus and a processing method are capable of properly and easily obtaining accurate data on the contact pressure applied by an end effector to a workpiece while a process is being carried out. A processing apparatus (7) processes a surface of a wafer (W) held by a spin chuck (22) (holding means) by bringing an end effector (40) into contact with the surface of the wafer (W). The end effector (40) can be retracted from the surface of the wafer (W) to a waiting position (25). A measuring and cleaning device (28) comprises, in combination, a measuring device (26) for measuring contact pressure to be applied to the wafer (W) by the end effector (40), and a cleaning device (27) for cleaning the end effector (40). The measuring device (26) has a table (60) for supporting the end effector (40), and a pressure sensor (62) for measuring a pressure applied to the table (60) to estimate a contact pressure actually applied by the end effector (40) to the wafer (W). The support surface of the table (60) and the surface of the wafer (W) held by the spin chuck (22) are on the same level.

18 Claims, 17 Drawing Sheets

SUBSTRATE SURFACE PROCESSING APPARATUS AND METHOD

BACKGROUND OF THE INVENTION

1. Field of the Invention

The present invention relates to a method of processing a substrate, such as a semiconductor wafer or a glass plate for an LCD, and a processing apparatus for carrying out the same.

2. Description of the Related Art

Generally, a semiconductor device fabricating process uses a cleaning system for clearing a surface of, for example, a semiconductor wafer (hereinafter referred to simply as "wafer") of contaminants, such as particles, organic contaminants and metallic impurities, adhering to the surface. Usually, a single-wafer cleaning system is provided with a spin processor.

This prior art processor carries out a 'scrub cleaning process' to remove effectively particles adhering to the surface of a wafer. The scrub cleaning process brings a rotating end effector provided on its lower surface with a brush or a sponge pad into contact with a surface of a wafer held by a spin chuck to scrub off particles and the like adhering to the surface of the wafer. The processor has an arm capable of vertical movement and turning, and an air cylinder actuator held on the free end of the arm. A spindle capable of vertical movement and rotation is disposed below the air cylinder actuator, and the end effector is attached to the lower end of the spindle.

The air cylinder actuator exerts a vertical thrust through the spindle to the end effector to press the end effector against the surface of the wafer. A contact pressure (force exerted per unit area) actually applied to the surface of the wafer by the end effector is equal to the sum of the thrust exerted on the end effector and the weight of the end effector. If an excessively high thrust is applied to the spindle and the contact pressure exceeds a permissible limit, the surface of the wafer will be damaged. The arm is provided with a weight sensor capable of sensing the thrust acting on the spindle to avoid damaging the surface of the wafer. The vertical actuating operation of the air cylinder actuator is controlled automatically on the basis of data obtained by the weight sensor in order that the contact pressure applied to the wafer by the end effector may be controlled through the regulation of the thrust acting on the spindle.

Although the weight sensor employed in the prior art processor is able to sense the thrust acting on the spindle, the same is unable to measure the contact pressure of the end effector directly. Therefore, the weight sensor is incapable of sensing the variation of the contact pressure actually applied to the surface of the wafer by the end effector with respect to a predetermined contact pressure due to disturbances affecting the spindle, such as the frictional resistance of a bearing and torque for rotating the spindle.

A prior art processor disclosed in JP-A No. 8-267023 holds a wafer by a spin chuck formed by detachably attaching a mount to a rotating shaft. When measuring a contact pressure actually applied to the surface of the wafer, the mount is replaced with a sensor for sensing the contact pressure applied by an end effector. The contact pressure applied by the end effector to the wafer W can be measured by bringing the end effector into contact with the sensor in a manner in which the end effector is brought into contact with the surface of the wafer W.

The prior art processor disclosed in JP-A No. 8-267023, however, needs to attach the sensor to the rotating shaft to measure the contact pressure applied by the end effector. For example, when successively cleaning twenty-five wafers one at a time, it is impossible to ascertain, while the wafers are in process, that the contact pressure applied actually to the surfaces of the wafers is truly in coincidence with the predetermined level. If it is desired to measure the contact pressure, the cleaning process needs to be interrupted, which reduces the throughput of the cleaning process. Work for attaching the sensor to the rotating shaft requires additional time.

Rise in the level of integration of semiconductor devices requires the enhancement of the precision of contact pressure control. However, the prior art processor has difficulty in precisely controlling the contact pressure applied by the end effector through the measurement of the contact pressure during a cleaning process and the adjustment of the thrust acting on the spindle on the basis of measured data. It is possible such incapability of the processor reduces the reliability of the cleaning process.

The prior art processor has the arm capable of vertical movement and turning, the spindle capable of vertical movement and rotation and supported on the free end of the arm, and the end effector attached to the lower end of the spindle. The arm is turned and moved several times (at least twice) at least from the center of the wafer to the circumferential edge of the same to clean the surface of the wafer uniformly. Since the prior art processor uses only the single end effector throughout the cleaning process, it is possible that particles adhered to the end effector in an initial stage of the cleaning process, i.e., in a precleaning stage in which the surface of the wafer is cleaned with water, are transferred and adhere again to the surface of the wafer in a final stage of the cleaning process, i.e., in a finish cleaning stage, to reduce the cleaning effect of the cleaning process.

It is preferable, in view of satisfactorily achieving the cleaning process, to use an end effector provided with a cleaning member, such as a brush, suitable for cleaning the surface of the wafer provided with a film, such as an oxide film, a polysilicon film, an aluminum film or a nitride film. Since only the single end effector is supported on the arm, the processor is able to clean satisfactorily the surfaces of wafers provided with only limited kinds of films. Accordingly, a plurality of processors are needed for carrying out different cleaning processes for cleaning wafers respectively provided with different kinds of films.

Furthermore, the end effector detachably attached to the spindle needs to be replaced with a new one when the functional property of the end effector is changed, the end effector is deformed or the density of the working surface of the end effector is made irregular by the repetitive use of the end effector for the cleaning process. Replacing the worn end effector with a new one needs manual work, takes time and increases maintenance work.

SUMMARY OF THE INVENTION

Accordingly, it is an object of the present invention to provide a processing apparatus and a processing method capable of properly and easily obtaining accurate data on the contact pressure applied by an end effector to a workpiece while a process is being carried out.

Another object of the present invention is to provide a processing apparatus and a processing method capable of readily changing an end effector so as to meet the purpose of a process, use and the number of cycles.

With the foregoing object in view, according to a first aspect of the present invention, a processing apparatus comprises a holding means for holding a substrate, an end effector to be brought into contact with a surface of the substrate held by the holding means and capable of being retracted to a waiting position away from the surface of the substrate, and a measuring means for measuring contact pressure applied by the retracted end effector in the waiting position.

When successively processing a plurality of substrates by the processing apparatus in the first aspect of the present invention, the end effector is retracted to the waiting position after the completion of one cycle of a process for processing a substrate. Then, the measuring means measures directly the contact pressure applied by the end effector to see whether or not a normal contact pressure is applied to the surface of the substrate. If the measured result indicates that the normal contact pressure is applied to the substrate, the next substrate is processed. The process is continued until an abnormal contact pressure outside a permissible range of contact pressure is detected. Since the contact pressure can properly be measured, the process is not interrupted. The contact pressure may automatically be adjusted to the predetermined contact pressure when the deviation of the contact pressure from the predetermined contact pressure is detected by measurement, the contact pressure may automatically be adjusted to the predetermined contact pressure. Since the measuring means is disposed beforehand at a position near the waiting position, any preparatory work for measurement is unnecessary and the contact pressure can simply be measured.

Preferably, the measuring means of the processing apparatus in the first aspect of the present invention comprises a table on which the end effector is placed, and a measuring mechanism capable of sensing and measuring a contact pressure applied to the table to determine a contact pressure applied by the end effector. The end effector is mounted on the table and a contact pressure applied to the table by the end effector is measured by the measuring mechanism. The contact pressure applied to the table can be considered to be equal to that applied to the substrate by the end effector.

Preferably, the table is disposed with its support surface on the level of the surface of the substrate held by the holding means. Thus the table is disposed with its support surface on the level of the surface of the substrate held by the holding means and the support surface of the table can be regarded as a substitute for the surface of the substrate. The condition of the end effector pressed against the table is equivalent to that of the same pressed against the surface of the substrate during the process. Therefore, the contact pressure need not directly be measured during the process and the contact pressure applied to the substrate during the process can accurately be estimated from the contact pressure measured with the end effector pressed against the table.

Preferably, the end effector is placed on a table, and a processing liquid supplying means supplies a processing liquid over the substrate held by the holding means, and the measuring means is provided with a processing liquid supplying mechanism for supplying the processing liquid. The processing liquid supplying means supplies the processing liquid to the substrate during the process to enhance the effect of the process. During the measurement of the contact pressure, the processing liquid supplying mechanism supplies pure water to serve as a substitute for the processing liquid supplying means. Thus, data accurately corresponding to the contact pressure applied to the substrate during the process can be obtained. If the processing liquid is pure water, it is desirable to supply the processing liquid over the end effector during the measurement to clean the end effector.

Preferably, a cleaning means for cleaning the end effector is disposed at the waiting position, and the cleaning means comprises a supporting member for supporting the end effector thereon and a cleaning liquid supplying mechanism for supplying a cleaning liquid. The end effector can be cleaned by the cleaning means. Preferably, the cleaning means and the measuring means are disposed close to each other. When the cleaning means and the measuring means are thus disposed, transition from a measuring operation for measuring the contact pressure to a cleaning operation for cleaning the end effector can quickly be achieved.

The processing apparatus may further comprise an end effector support member for supporting the end effector, and a plurality of spare end effectors capable of being supported on the end effector support member may be kept in reserve. The end effector supported on the end effector support member is used for processing the surface of a substrate, and the end effector is replaced with selected one of the spare end effectors according to the purpose and use of the process or after the end effector has been used for a predetermined number of cycles of the process. The selected end effector is attached to the end effector support member for the subsequent cycle of the process.

Preferably, the processing apparatus is provided with first and second end effectors, and the first and the second end effector are attached alternately to the end effector support member. When processing a substrate, the first end effector is attached to the end effector support member to use the same for a first process, such as a preprocess, and then the first end effector is replaced with the second end effector to use the second end effector for a second process, such as a finishing process. Therefore, particles adhered to the first end effector during the first process are not carried over to the second process. The uncontaminated second end effector is used for processing the surface of the substrate by the second process. The use of the first and the second end effector for the first and the second process, respectively, prevents the redeposition of the particles removed by the first process on the substrate during the second process, which enhances processing effects.

According to a second aspect of the present invention, a processing apparatus for processing substrates comprises a substrate holding means for holding a substrate, end effectors to be brought into contact with the surface of the substrate held by the substrate holding means to process the surface of the substrate, and an end effector shifting means for shifting each of the end effectors between an end effector changing position where the end effector is replaced with another end effector and an end effector keeping position where the end effector is kept; wherein the plurality end effectors are kept in reserve, and desired one of the plurality of end effectors is attached to the end effector support member.

When the processing apparatus according to the second aspect of the present invention changes the end effector, the end effector support member is moved to the end effector changing position, the end effector is removed from the end effector support member, and the end effector is transferred to the end effector shifting means. The end effector shifting means shifts the end effector removed from the end effector support member from the end effector changing position to the end effector keeping position, shifts selected one of the end effectors from the end effector keeping position to the end effector changing position. The end effector support member is moved to the end effector changing position, the selected end effector is attached to the end effector support member to complete an end effector changing operation.

An end effector shifting arrangement will concretely be described. Preferably, the end effector shifting means includes a turning table provided thereon with a plurality of support vessels for supporting the end effectors thereon. The end effector shifting means may be provided with a cleaning liquid supplying mechanism to supply a cleaning liquid over the end effector to clean the same.

Preferably, the end effector support member is an arm, a spindle is supported for rotation and vertical movement on the arm, and the end effector can detachably attached to the lower end of the spindle so that the end effector can be replaced with another one. Thus, the end effector can easily be attached to and removed from the arm.

Preferably, the spindle is provided its lower end part with a hooking part, and the end effector is provided with a retaining part with which the hooking part is engaged. The hooking part of the spindle is engaged firmly with the retaining part of the end effector to connect the end effector to the spindle so that the end effector may not fall of f the spindle during the process. When replacing the end effector with another one, the hook part is disengaged from the retaining part, the end effector is removed from the spindle, and then the hook is engaged with the retaining part of another end effector.

The end effector may be provided on its upper part with a projection, and the spindle may be provided on its lower end part with a chucking mechanism capable of gripping the projection. This arrangement, similarly to that mentioned in claim 7, enables the arm to achieve work for removing the end effector from and attaching the end effector to the spindle.

According to a third aspect of the present invention, a processing method, which process a surface of a substrate held by a holding means by bringing an end effector into contact with the surface of the substrate, moves the end effector away from a position above the substrate and measures contact pressure to be applied by the end effector to the substrate during a process for processing the substrate and/or during a period in which the substrate held by the holding means is removed from the holding means and carried away, and another substrate is held by the holding means for processing.

This processing method is able to measure the contact pressure, for example, while a plurality of substrates are being processed successively without interrupting a processing operation for successively processing the substrates.

Preferably, the end effector is moved away from the position above the substrate and cleaned during a process for processing the substrate and/or during a period in which the substrate held by the holding means is removed from the holding means and carried away, and another substrate is held by the holding means for processing. Thus, the end effector can be cleaned without interrupting a processing operation for successively processing the substrates.

Preferably, a plurality end effectors are kept in reserve, and the end effector is changed periodically. Thus, the end effector is replaced with another one after processing one or a plurality of substrates. End effector changing time may optionally be determined so as to meet the purpose of the process, use and the number of cycles. For example, in a process for processing one substrate, the end effector may be changed for each of a first stage for a preprocess, a second stage for an intermediate process, a third stage for a second intermediate process, and a fourth stage for a finishing process. The end effector may be changed when the end effector is deformed, after the end effector has been used for a predetermined time for processing or after the end effector has been used for processing a predetermined number of substrates. For example, an end effector or a set of end effectors is used continuously, the end effector or the set of end effectors is replaced with another end effector or another set of end effectors when the former is deformed, the end effectors are subjected to maintenance work after all the available end effectors have been deformed. The plurality end effectors are removed and a plurality of new end effectors are kept in reserve. The prior art processing method uses only one end effector and needs to carry out maintenance work every time the end effector deteriorates. The processing method of the present invention extends a maintenance period and reduces time necessary for maintenance work.

Preferably, the processing method keeps a plurality of end effectors of different types in reserve to use those end effectors selectively for surface processing according to the surface condition of the substrate. Thus, the end effectors of different types suitable for processing films of different kinds formed on the surfaces of substrates are used selectively. Accordingly, one processing system can be used for processing substrates provided with different kinds of films, respectively, and footprint can be saved.

Preferably, first and second end effectors are kept in reserve, the first end effector is used for processing a substrate by a first process, and the second end effector is used for processing the same substrate by a second process.

DESCRIPTION OF THE PREFERRED EMBODIMENTS

First, a first embodiment and a third embodiment according to the present invention will be described.

The preferred embodiments of the present invention will be described as applied to surface processing apparatuses for cleaning the surfaces of wafers, i.e., substrates.

Figure 1:
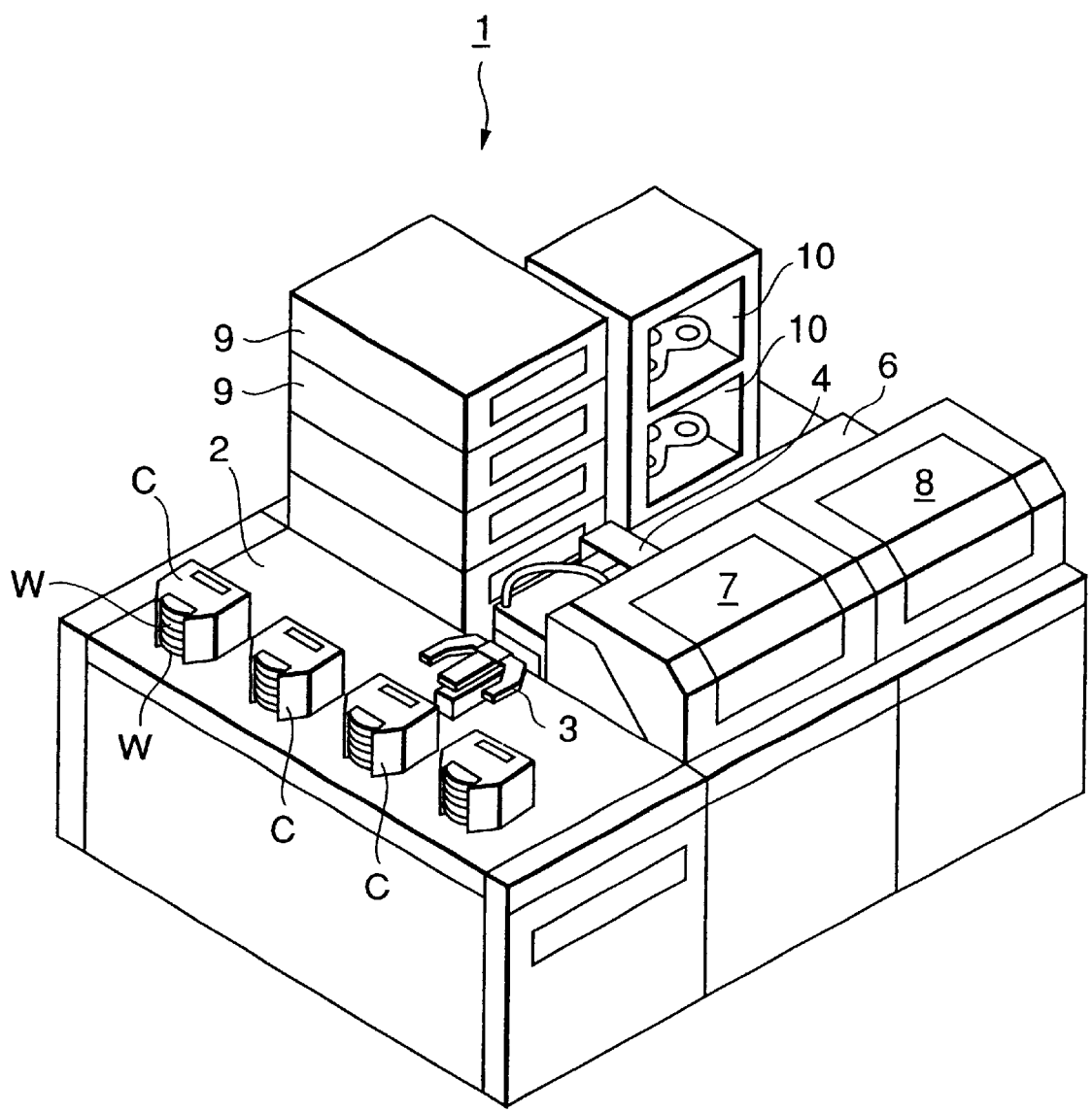
FIG. 1 is a perspective view of a cleaning system provided with a surface processing apparatus embodying the present invention.

Referring to FIG. 1 showing a cleaning system 1 provided with a surface processing apparatus 7 in the first embodiment in a perspective view, carriers C each containing a plurality of wafers W are fed to the cleaning system 1, the cleaning system 1 cleans and dries the wafers W one at a time, and the carriers C each containing a plurality of cleaned and dried wafers W are delivered to the next process.

The cleaning system 1 has a table 2 capable of supporting four carriers C containing wafers W. A wafer handling device 3 is disposed in a central part of the cleaning system 1. The wafer handling device 3 takes out the wafers W one at a time from the carrier C mounted on the table 2, and returns the processed wafers W to the carrier C. A carriage 4 is disposed behind the wafer handling device 3 to receive the wafer W from and to return the processed wafer W to the wafer handling device 3. The carriage 4 moves along a carrying passage 6 extended in a middle part of the cleaning system 1. Processing apparatuses are arranged on the opposite sides of the carrying passage 6. More specifically, the surface processing apparatus 7 for cleaning the surfaces of wafers W and a surface processing apparatus 8 for cleaning the back surfaces of wafers W are arranged, for example, on one side of the carrying passage 6. A stack of four heating devices 9 is disposed on the other side of the carrying passage 6. The heating devices 9 heat and dry wafers W. A stack of two wafer inverting apparatuses 10 is disposed near the heating devices.

Figure 2:
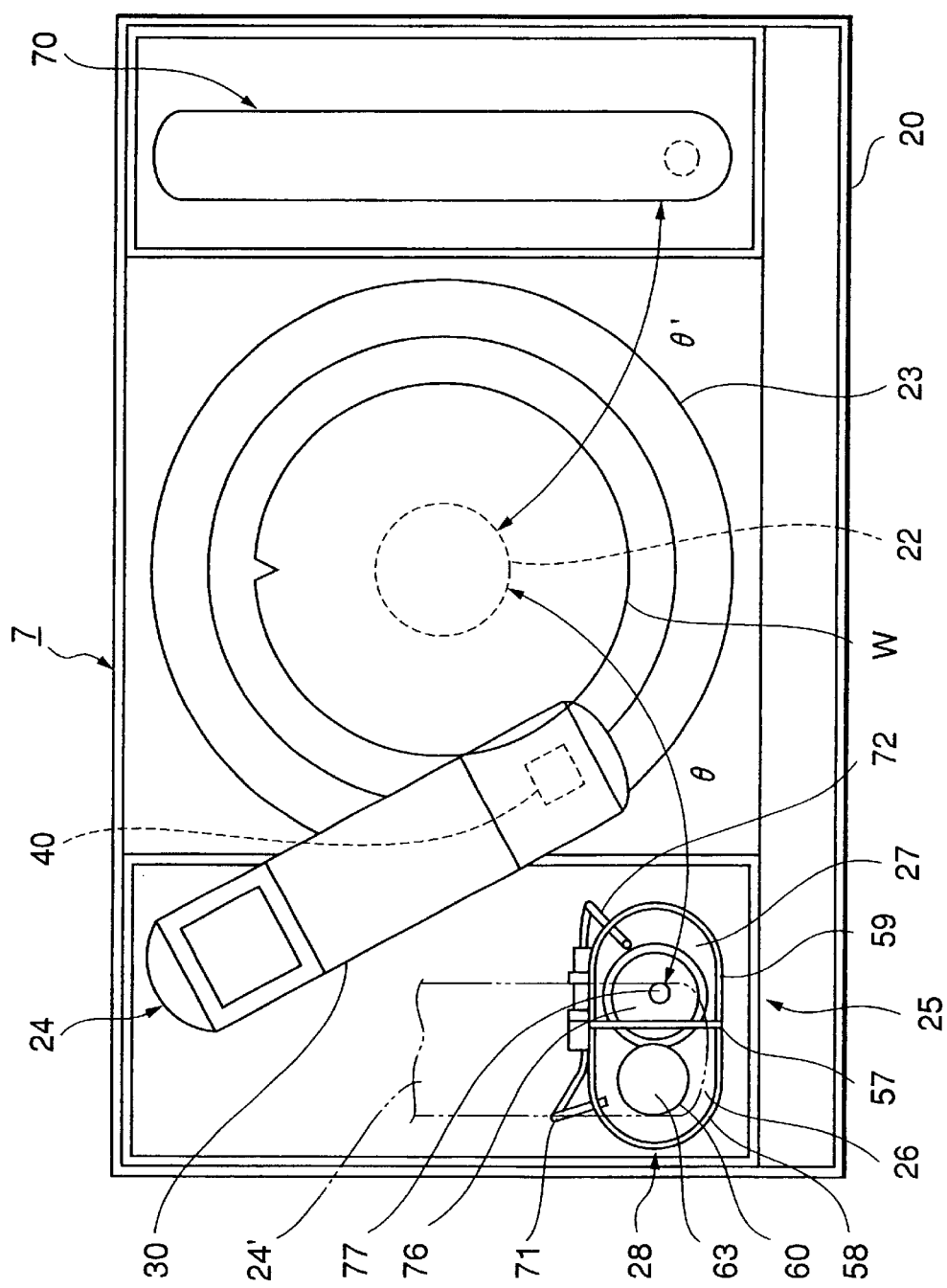
FIG. 2 is a plan view of the internal configuration of a surface processing apparatus in a first embodiment according to the present invention.
Figure 3:
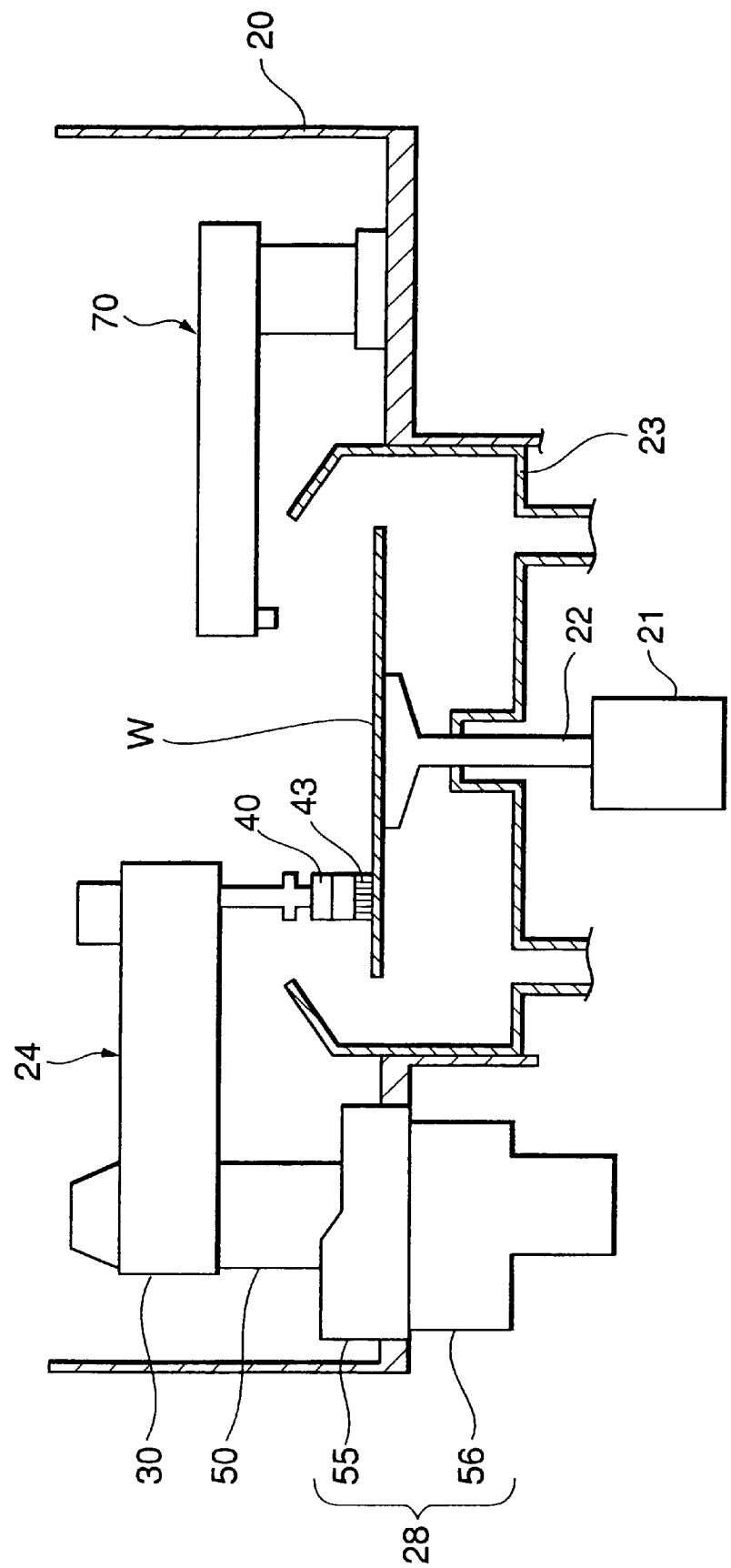
FIG. 3 is a sectional view of the internal configuration of the surface processing apparatus in the first embodiment.

The surface processing apparatus 7 will be described. FIGS. 2 and 3 are a plan view and a sectional view, respectively, of the internal configuration of the surface processing apparatus 7. The surface processing apparatus 7 has a case 20, a spin chuck 22 for holding a wafer W in a horizontal position, a motor 21 for rotating the spin chuck 22, and a guard cup 23 surrounding the spin chuck 22 and the wafer W held on the spin chuck 22 to prevent a processing liquid poured over the surface of the wafer W from scattering around. The spin chuck 22 is disposed in a central region of the interior of the case 20.

The surface processing apparatus 7 scrubs the surface of the wafer W held by the spin chuck 22 with an end effector 40, which will be described later, to clean the surface. A scrub cleaning device 24 provided with the end effector 40 is capable of retracting the end effector 40 to a waiting position 25 apart from the surface of the wafer W. A measuring and cleaning device 28 is disposed at the waiting position 25. The measuring and cleaning device 28 comprises a measuring device 26 for measuring contact pressure (force per unit area) to be applied to the wafer W by the end effector 40, and a cleaning device 27 for cleaning the end effector 40.

Figure 4:
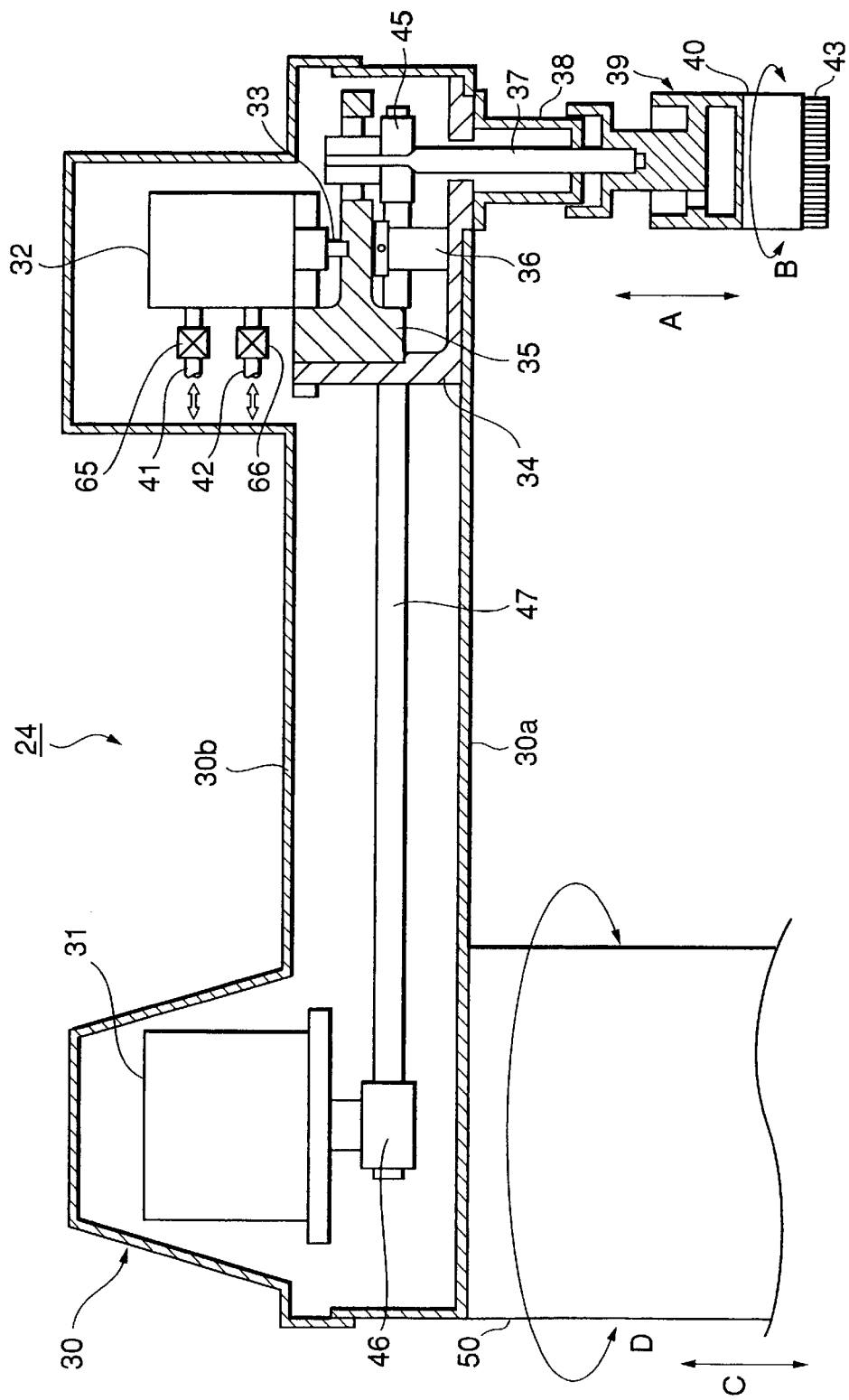
FIG. 4 is a sectional view of a scrubbing cleaning device.

As shown in FIG. 4, an arm 30 has a frame 30a and a cover 30b. A motor 31 is disposed in a base end part of the cover 30b, and an air cylinder actuator 32 is disposed in a free end part of the cover 30b. A rod 33 projects downward from the air cylinder actuator 32. A lifting member 35 is connected to the rod 33 so as to move vertically along a guide member 34. A weight sensor 36 is put on the upper surface of the frame 30a, and the lower end of the lifting member 35 is in contact with the weight sensor 36. The weight sensor 36 measures downward pressure exerted by the lifting member 35. Thus, the scrub cleaning device 24 is able to sense thrust applied to a spindle 37 during a cleaning process. The thrust of the rod 33 can be regulated on the basis of the pressure exerted by the lifting member 35.

The spindle 37 has an upper part supported for rotation on one end part of the lifting member 35 and a lower part projecting downward from the arm 30. The lower part of the spindle 37 is covered with a protective cover 38. The end effector 40 is detachably connected to a lower end part of the spindle 37 by a connecting member 39. The spindle 37 is moved vertically to move the processing member 40 vertically, i.e., in the directions of the arrows A shown in FIG. 4.

Air is supplied through a first air port 41 into the air cylinder actuator 32 and air is discharged through a second air port 42 from the air cylinder actuator 32 to move the lifting member 35 downward together with the spindle 37 by the rod 33. Air is supplied through the second air port 42 into the air cylinder actuator 32 and air is discharged through the first air port 41 from the air cylinder actuator 32 to move the lifting member 35 upward together with the spindle 37 by the rod 33. A contact pressure equal to the sum of the weight of the end effector 40 and a downward thrust applied by the spindle 37 to the end effector 40, i.e., or a low contact pressure necessary only to prevent the separation of the end effector 40 from the surface of a wafer W, such as a pressure not greater than 60 gf, i.e., a contact pressure lower than the weight of the end effector 40 equal to the difference between the weight of the end effector 40 and an upward thrust applied by the spindle 37 to the end effector 40, is applied to the surface of the wafer W depending on the type of the cleaning process.

A cleaning member 43, such as a brush or a sponge pad, for cleaning the surface of the wafer W is attached to the lower surface of the end effector 40. A hard brush, such as a nylon brush with hard bristles, or a soft brush with soft bristles, such as a mohair brush, is used selectively as the cleaning member 43 depending on the surface quality of a workpiece to be processed.

A driven pulley 45 is fixedly put on a part of the spindle 37 near the upper end of the same, a drive pulley 46 is mounted fixedly on the output shaft of the motor 31, and a belt 47 is extended between the driven pulley 45 and the drive pulley 46. The motor 31 drives the spindle 37 through the drive pulley 46, the belt 47 and the driven pulley 45. Consequently, the end effector 40 is rotatively oscillated together with the spindle 37 in the directions of the arrows B shown in FIG. 4.

Referring to FIGS. 3 and 4, the base end part of the arm 30 of the scrub cleaning device 24 is fastened in a horizontal position to the upper end of a shaft 50. The shaft 50 is moved vertically in the directions of the arrows C (FIG. 4) and rotatively oscillated in the directions of the arrows D (FIG. 4) by a driving mechanism, not shown. The driving mechanism turns the arm 30 in the directions of the arrows θ (FIG. 2) between the waiting position 25 and a working position above the wafer W.

Figure 5:
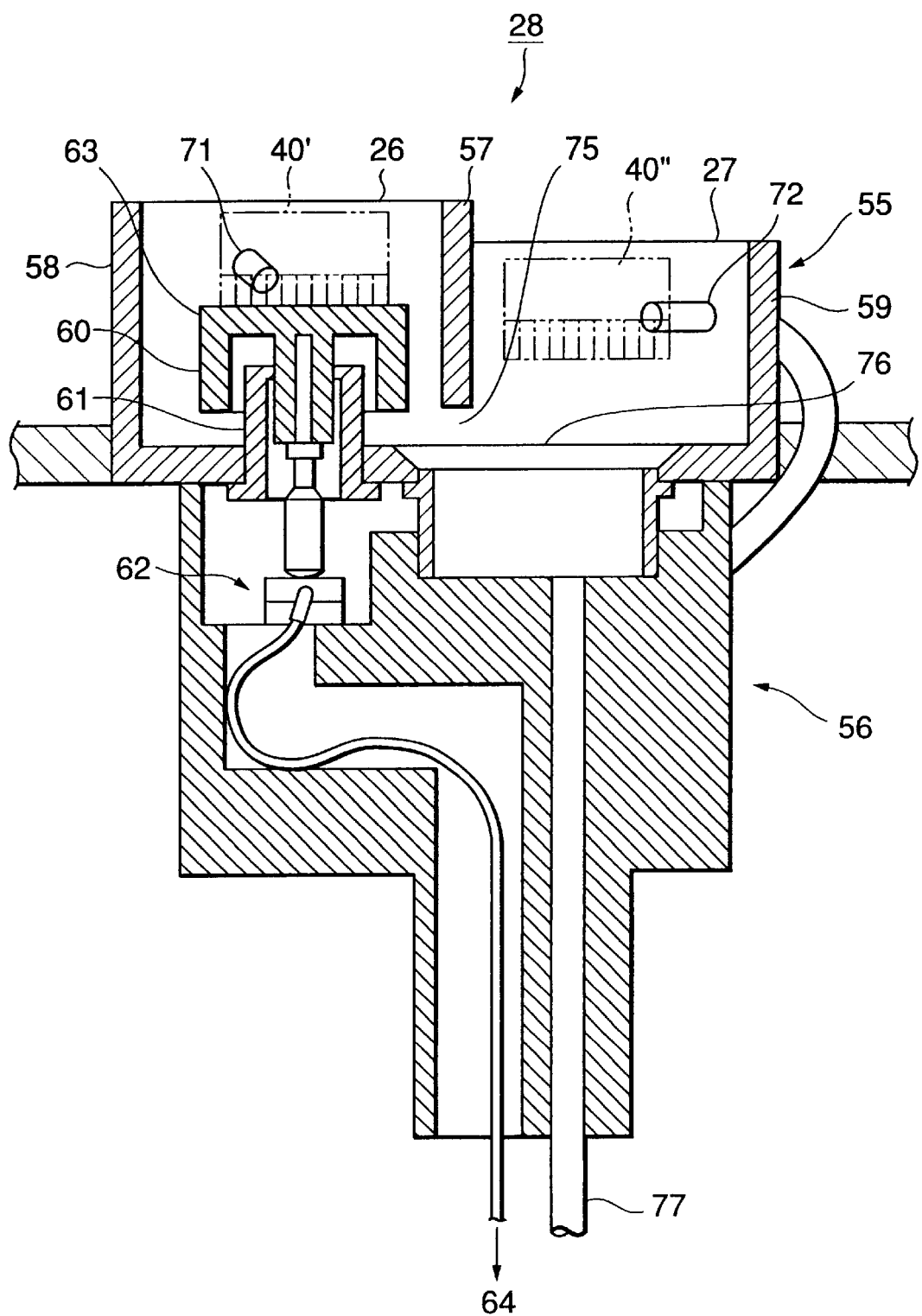
FIG. 5 is a sectional view of a measuring and cleaning device.

When the scrub cleaning device 24 is located at a position indicated by chain double-dash lines in FIG. 2, the end effector 40 is retracted to the waiting position 25 and is located above the measuring and cleaning device 28. As shown in FIG. 5, the measuring and cleaning device has a cup 55 protruding from the upper wall of the case 20, and a base 56 supporting the cup 55. The cup 55 is substantially cylindrical and has an open upper end. The cup 55 is divided into two symmetrical parts by a partition wall 57. One of the two parts is used as a first container 58 specially for the measuring device 26, and the other us used as a second container 59 specially for the cleaning device 27. The height of the first container 58 is slightly greater than that of the second container 59.

The scrub cleaning device 24 is turned by the driving mechanism to move the end effector 40 to a position above the measuring device 26 in the first container 58 as represented by an end effector 40' indicated by chain double-dashed lines in FIG. 5. In the first container 58 containing the end effector 40', a table 60, on which the end effector 40' is mounted, is disposed on a base member 61 fixed to the bottom wall of the first container 58. A sensing rod included in a pressure sensor 62 is extended through the base member 61 and is fitted in a bore formed in the table 60. A contact pressure applied to the table 60 by the end effector 40' brought into contact with the support surface 63 of the table 60 is measured directly by the pressure sensor 62. Thus, a contact pressure to be applied by the end effector 40', i.e., the sum of a thrust applied to the end effector 40' through the spindle 37, the weight of the end effector 40' and a frictional resistance exerted by the spindle 37, can directly be measured.

Figure 6:
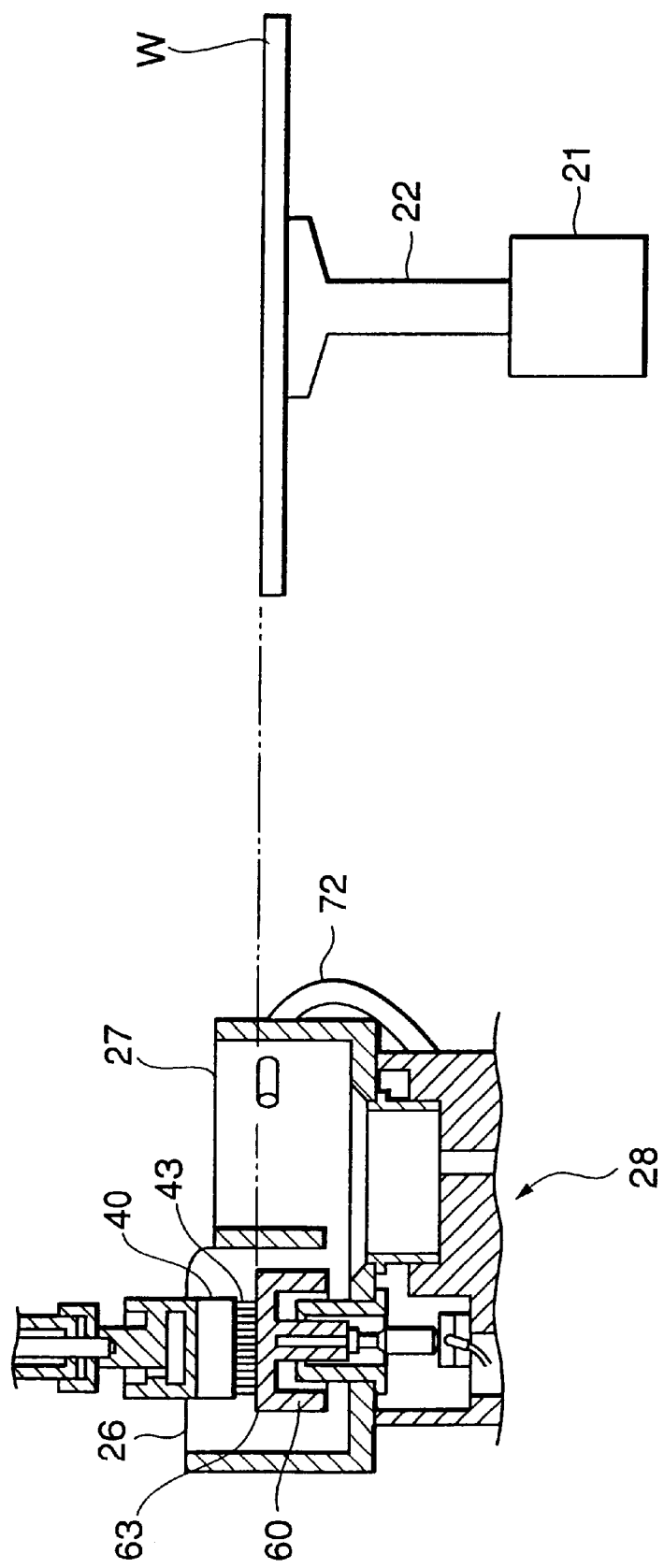
FIG. 6 is a sectional view of assistance in explaining the coincidence of the level of the surface of a table, and that of the surface of a wafer held by a spin chuck.

As shown in FIG. 6, the support surface 63 of the table 60 is flush with the surface of the wafer W held by the spin chuck 22. Therefore, exactly the same conditions as those for cleaning the wafer W including the distance between the surface of the wafer W and the arm 30 and a thrust applying mode in which a thrust is applied to the spindle 37 by the air cylinder actuator 32 can be created. Accordingly, the contact pressure applied by the end effector to the wafer W during the cleaning process can accurately be measured by the measuring device 26.

Figure 7:
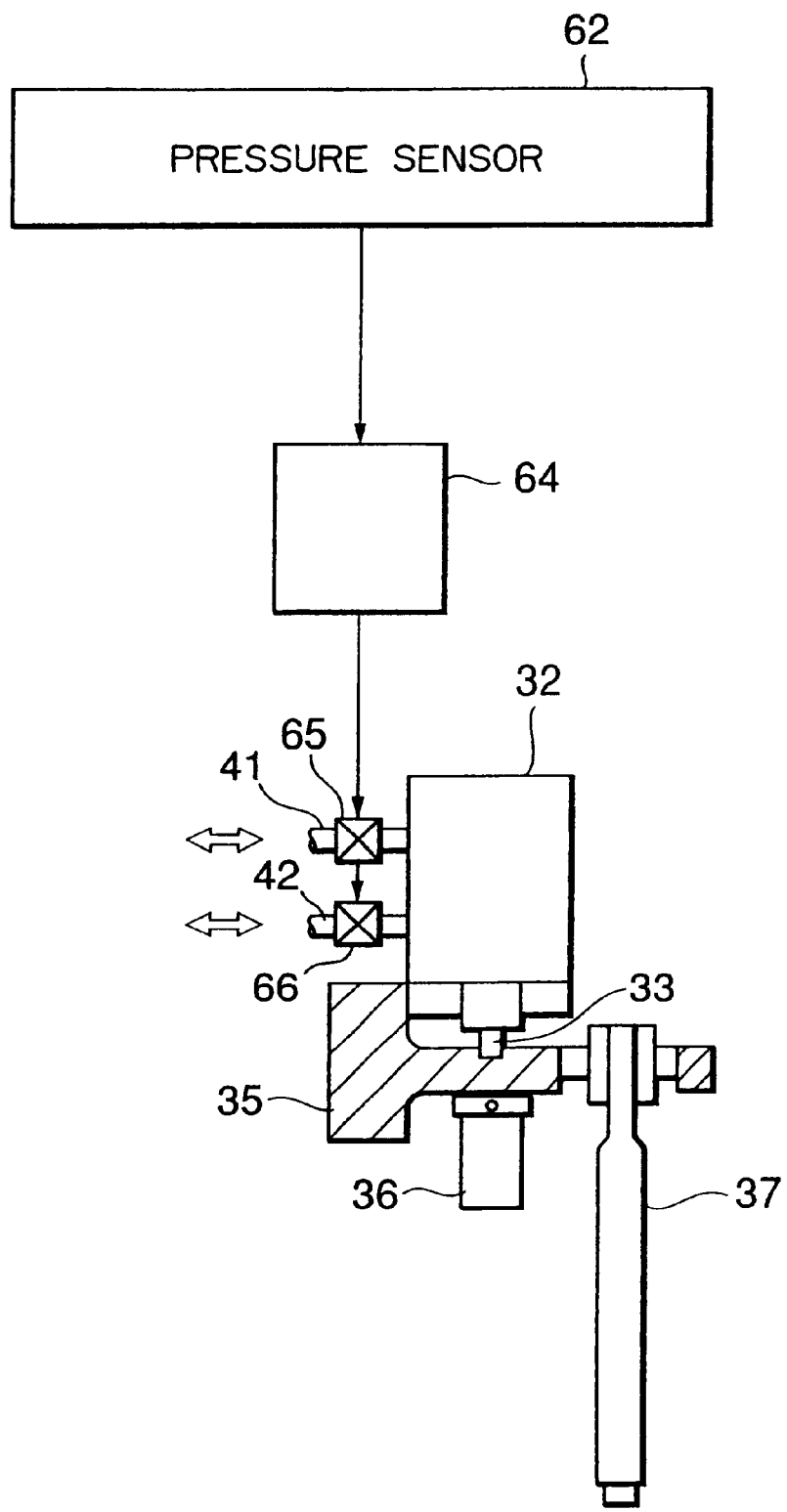
FIG. 7 is a view of assistance in explaining a mechanism for controlling axial thrust applied to a spindle.

The pressure sensor 62 gives a signal representing a measured pressure to a controller 64 (FIG. 7). If the measured contact pressure is different from a set contact pressure, the controller 64 executes a control program stored beforehand therein to send adjustment signals to a first pressure regulating valve 65 combined with the first air port 41, and a second pressure regulating valve 42 combined with the second air port 42. Thus, the thrust applied through the lifting member 35 to the spindle 37 by the rod 33 is adjusted to adjust the contact pressure applied by the end effector 40 to the set contact pressure. After the working contact pressure has been adjusted to the set contact pressure, the weight sensor 36 measures a pressure applied thereto by the lifting member 35, and data on the measured pressure is stored. During the cleaning process, measured data obtained by the weight sensor 36 is compared with the stored data to monitor the behavior of the lifting member 35 and the spindle 37

The contact pressure is measured in a period in which a cleaned wafer W is removed from the spin chuck 22 and carried away, and the next wafer W to be cleaned is held by the spin chuck 22. Thus, the scrub cleaning device 24 is turned to the waiting position 25 and the contact pressure is measured by the measuring device 26 in an interval between the successive cleaning cycles. Any component parts of the measuring system need not be attached to the surface processing apparatus 7 or the cleaning process need not be interrupted for a long time to measure the contact pressure.

The surface processing apparatus 7 has a pure water pouring device 70 disposed so that the scrub cleaning device 24 and the pure water pouring device 70 are symmetrical with respect to the spin chuck 22. The pure water pouring device 70 turns in the directions of the arrows θ' (FIG. 2). The pure water pouring device 70 pours pure water, i.e., processing liquid, on the surface of the wafer W while the surface processing apparatus 7 is operating for the cleaning process. As mentioned above, it is preferable to create exactly the same conditions as those for cleaning the wafer W by the cleaning process when measuring the contact pressure by the measuring device 26 for the accurate measurement of the contact pressure. A nozzle included in a pure water pouring device 71 is projected into the first container 58 to pour pure water over the end effector 40 when measuring the contact pressure.

In FIG. 5, the end effector 40" indicated by chain double-dash lines is located in the second container 59 by turning the scrub cleaning device 24 by the driving mechanism to a position above the measuring device 26. A nozzle included in a pure water pouring device 72 for pouring pure water as a cleaning liquid is projected into the second container 59 containing the end effector 40". The end effector 40" is placed in the second container 59 in a period between the successive cycles of the cleaning process, and pure water pouring device 72 pours pure water over the end effector 40" to clean the end effector 40". The containers 58 and 59 communicate with each other by an opening 75 formed in a lower part of the partition wall 57. A sump 76 is formed in the bottom of the second container 59 so as to extend into the bottom of the first container 58. A drain pipe 77 is connected to the sump 76 to drain pure water supplied into the containers 58 and 59 outside the surface processing apparatus 7.

Figure 8:
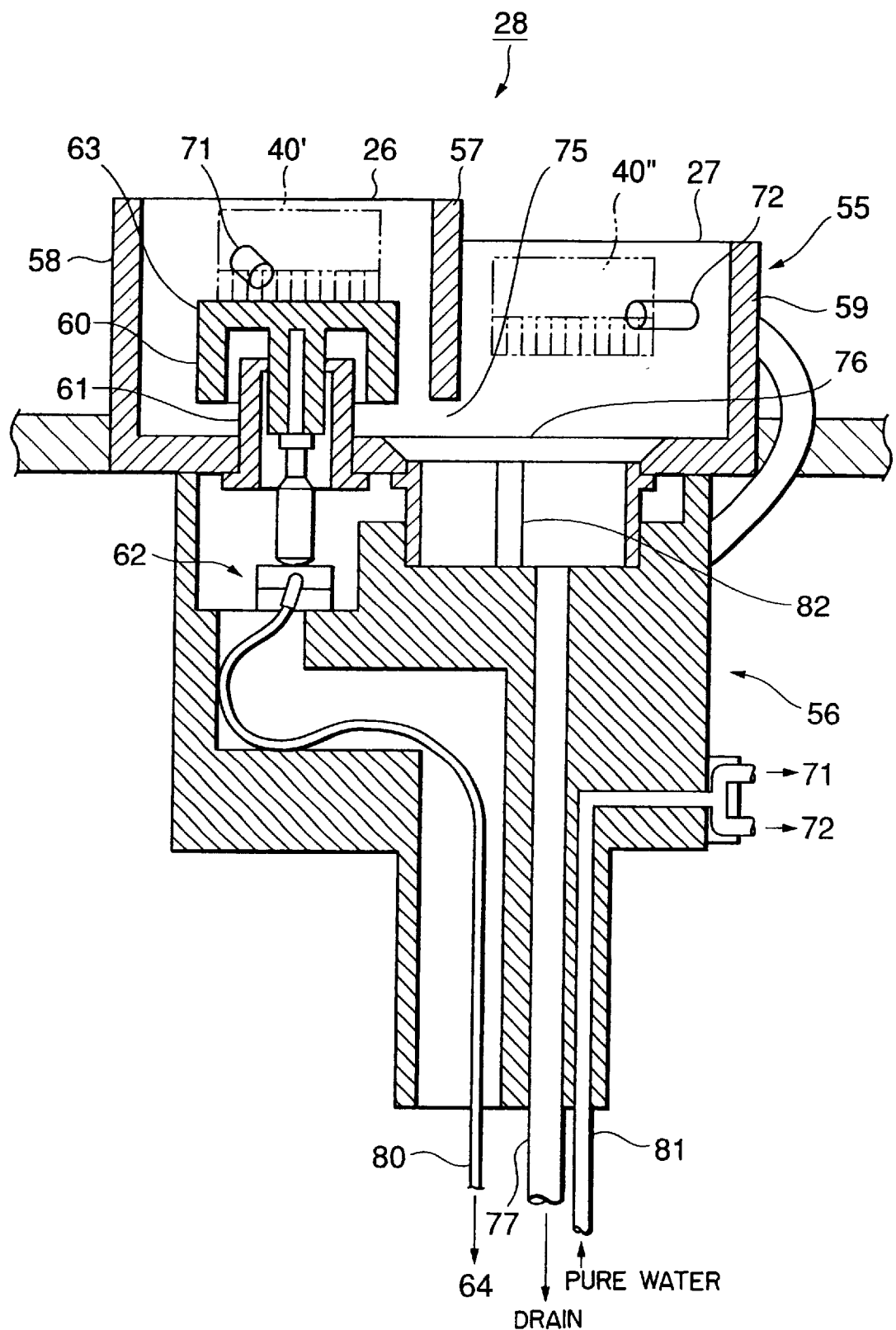
FIG. 8 is a sectional view of a modification of the measuring and cleaning device.

If the drain pipe 77 does not have a sufficiently great diameter, the used pure water may possibly overflow the sump 76 and flow into a space in which the pressure sensor 62 is disposed. Therefore, a second drain hole 82 may be formed in the side wall of the sump 76 as shown in FIG. 8 to prevent the used pure water from flowing into the space in which the pressure sensor 62 is disposed. In an arrangement shown in FIG. 5, pure water is supplied through a pipe extended outside the base 56 to the pure water pouring devices 71 and 72. In an arrangement shown in FIG. 8, pure water is supplied through a pure water supply pipe 81 extended through the base 56 to the pure water pouring devices 71 and 72, and a signal line 80 connected to the controller 64, the drain pipe 77 and the pure water supply pipe 81 are extended in a lower part of the base 56.

The wafer processing operation of the cleaning system 1 provided with the surface processing apparatus 7 will be described below. A carrying robot, not shown, carries a carrier C containing, for example, twenty-five wafers W to be cleaned to the table 2. The wafers W are taken out from the carrier C one at a time, and the wafer is transferred to the carriage 4 by the wafer handling device 3. The surface processing apparatuses 7 and 8 clean the wafers W one by one to remove organic contaminants and particles from the wafers W. The wafers W thus cleaned are heated and dried by the heating device 9. Then, the wafers W are transferred from the carriage 4 to the wafer handling device 3. The wafer handling device 3 returns the cleaned wafers W into the carrier C.

The cleaning process to be carried out by the surface processing apparatus 7 will be described. A wafer W is carried into the surface processing apparatus 7, the wafer W is held by the spin chuck 22, and then the spin chuck 22 holding the wafer W starts rotation. As shown in FIG. 2, the arm 30 is turned from the waiting position 25 to a position above the wafer W, and the end effector 40 is brought into contact with the surface of the wafer W as shown in FIG. 3. Subsequently, the air cylinder actuator 32 is actuated to apply a thrust to the spindle 37 in order that the end effector 40 is pressed against the surface of the wafer W so as to apply a predetermined contact pressure (force per unit area) to the surface of the wafer W. In this stage, the arm 30 is turned so that the end effector 40 is moved at least from the center to the periphery of the wafer W. Thus, the surface of the wafer W is cleaned uniformly. Meanwhile, the nozzle of the pure water pouring device 70 is moved to a position above the wafer W and the pure water pouring device 70 pours pure water over the wafer W.

A scrub cleaning operation and a megasonic cleaning operation are continued for a predetermined time to clean the wafer W. Then, the arm 30 is turned to the waiting position 25 to move the end effector 40 away from the working position above the wafer W. The wafer W thus cleaned is carried from the surface processing apparatus 7 to the surface processing apparatus 8 by the carriage 4. The next wafer W is fed to the surface processing apparatus 7. Thus, the foregoing surface processing cycle is repeated.

Data on a pressure to be applied by the lifting member 35 necessary to apply a predetermined contact pressure by the end effector 40 to the wafer W is stored in the weight sensor 36. Although the thrust applied by the spindle 37 can be monitored during the cleaning process through the measurement of the downward pressure of the lifting member 35 by the weight sensor 36, the contact pressure applied by the end effector 40 to the wafer W cannot directly be measured. The direct measurement of the contact pressure applied by the end effector 40 to the wafer W is essential to the achievement of the cleaning process with reliability.

The contact pressure applied by the end effector 40 is measured in a period in which the preceding cleaned wafer W is removed from the spin chuck 22 and the succeeding wafer W is held by the spin chuck. When the wafers W are subjected successively to the cleaning process, the scrub cleaning device 24 is retracted to the waiting position every time the cleaning process for cleaning one wafer W is completed to retract the end effector 40 to the waiting position 25 in the first container 58. Then, the contact pressure applied by the end effector 40 is measured directly by the measuring device 26.

More specifically, the end effector 40 is mounted on the table 60, and the contact pressure applied by the end effector 40 to the table 60 is measured by the pressure sensor 62. The contact pressure applied by the end effector 40 to the table 60 can be considered to be equal to the contact pressure actually applied to the wafer W by the end effector 40. When measuring the contact pressure, the support surface 63 of the table 60 is considered to be the surface of the wafer W held by the spin chuck 22. The support surface 63 of the table 60 is flush with the surface of the wafer W held by the spin chuck 22. The pure water pouring device 70 pours pure water over the wafer W during the cleaning process to enhance the effect of the cleaning process. Similarly, the pure water pouring device 72 pours pure water during the measurement of the contact pressure to simulate a condition created by the pure water pouring device 70. Thus, exactly the same state as that in which the end effector 40 is in contact with the surface of the wafer W can be created. Consequently, accurate data on the contact pressure applied by the end effector 40 during the cleaning process can be obtained by measuring the contact pressure by the measuring device 26 instead of measuring the same during the cleaning process. Pure water is poured over the end effector 40 during the measurement of the contact pressure to clean the end effector 40.

When measurement proved that the contact pressure is normal, the next wafer W is subjected to the cleaning process. The cleaning process is thus repeated continuously until a contact pressure outside a permissible range is measured. The cleaning process can continuously be repeated without interruption because the contact pressure can be measured without interrupting the cleaning process. When an abnormal contact pressure is measured, the controller 64 gives provides a control signal to control the mode of operation of the air cylinder actuator 32 automatically as shown in FIG. 7 to adjust the contact pressure to the predetermined contact pressure by adjusting the thrust applied by the spindle 37 to the end effector 40. Since the measuring device 26 is installed at the waiting position, any preparatory work for the measurement of the contact pressure is not necessary and the contact pressure can simply be measured.

After the measurement of the contact pressure has been completed, the end effector 40 is placed in the second container 59 of the cleaning device 27, and pure water is poured over the end effector 40 by the pure water pouring device 72 to clean the end effector 40. Since the measuring device 26 and the cleaning device 27 are disposed close to each other, transition from a measuring operation for measuring the contact pressure to a cleaning operation for cleaning the end effector 40 can quickly be achieved.

Thus, the wafers W are processed successively by the predetermined process, the processed wafers are returned to the carrier C, and the carrier C containing the twenty-five processed wafers W is delivered from the cleaning system 1.

The surface processing apparatus 7 in the first embodiment measures the contact pressure applied by the end effector 40 simply by the measuring device installed at the waiting position 25 to estimate accurately the contact pressure actually applied to the wafer W. The measurement of the contact pressure does not reduce the throughput and does not take much time. Since the contact pressure corresponding to the contact pressure actually applied by the end effector 40 on the wafer during the cleaning process can accurately be measured, the contact pressure can properly be monitored and abnormal contact pressures and the change of the contact pressure can readily be detected. Consequently, the contact pressure can precisely be controlled to enhance the reliability of the cleaning process.

Although the invention has been described in connection with the preferred embodiment thereof, the present invention is not limited thereto in its practical application and various modifications thereof are possible. For example, substrates need not be limited to the semiconductor wafers mentioned in the foregoing description, but may be substrates for LCDs, glass substrates, substrates for CDs, photomasks, printed wiring boards or ceramic substrates. The processing liquid need not be limited to pure water, but may be hydrogen peroxide, aqueous ammonia, hydrofluoric acid, hydrochloric acid or sulfuric acid.

According to the present invention, the contact pressure actually applied by the end effector can accurately be estimated through the measurement of the contact pressure applied by the end effector by the measuring means installed at the waiting position and the measurement can simply be achieved. Therefore, The measurement of the contact pressure does not reduce the throughput and does not take much time.

Since the contact pressure exactly corresponding to the contact pressure applied by the end effector during the process can accurately be measured by the measuring means, the contact pressure can properly be monitored and abnormal contact pressures and the change of the contact pressure can readily be detected. Consequently, the contact pressure can precisely be controlled to enhance the reliability of the cleaning process. The surface processing apparatus can satisfactorily deal with miniaturization techniques for, for example, semiconductor device fabricating processes.

The end effector can be cleaned. Transition from a measuring operation for measuring the contact pressure to a cleaning operation for cleaning the end effector can quickly be achieved and hence the throughput can be increased.

The through put is not reduced because the contact pressure can properly be measured. The end effector can be cleaned.

A second embodiment according to the present invention will be described hereinafter.

The present invention will be described as embodied in a surface processing apparatus for cleaning surfaces of wafers as an example of a substrate.

FIG. 1 is a perspective view of a cleaning system 1 provided with a surface processing apparatus 7 embodying the present invention.

Figure 9:
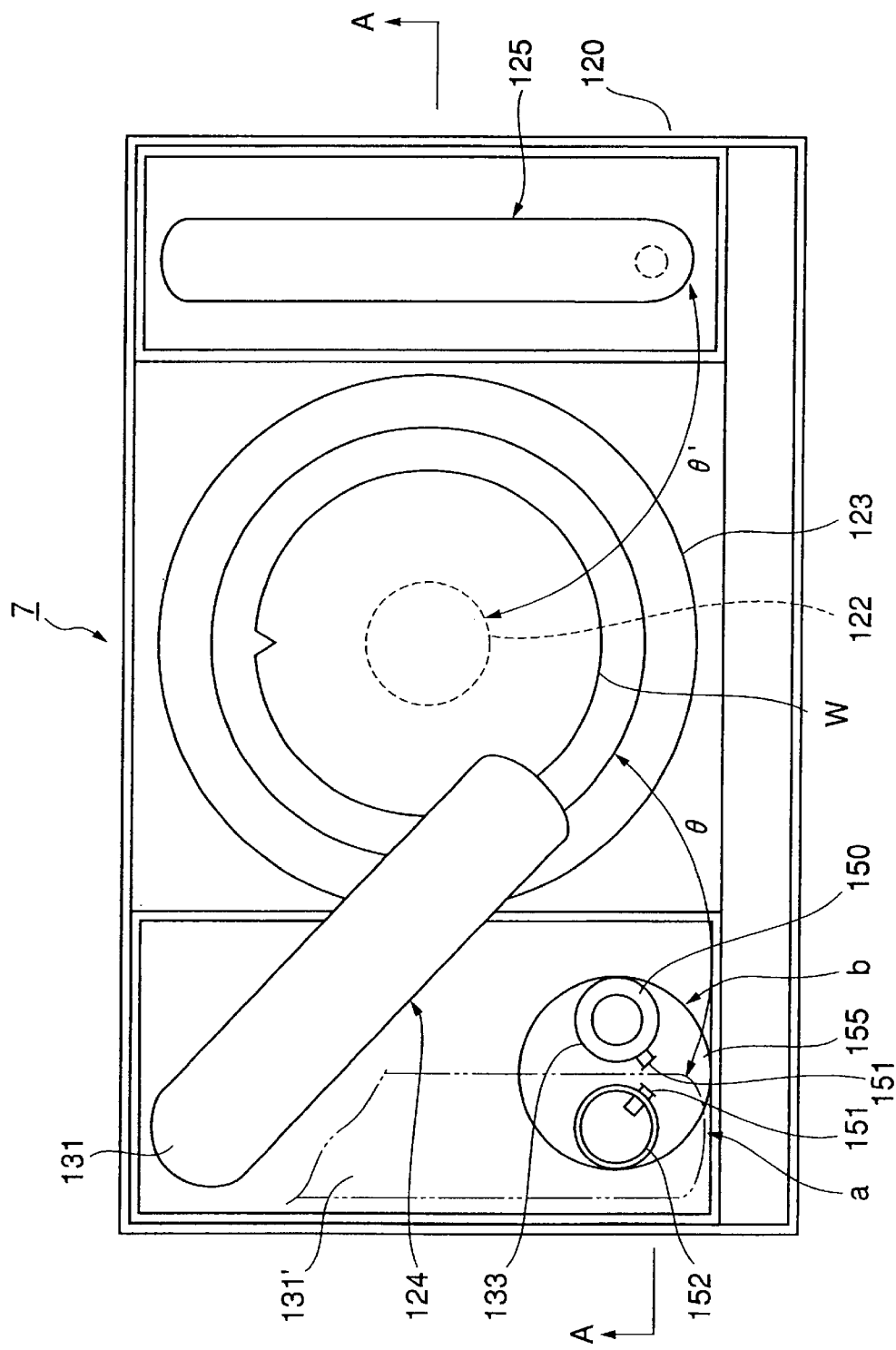
FIG. 9 is a plan view of the internal configuration of a surface processing apparatus in second embodiment according to the present invention.
Figure 10:
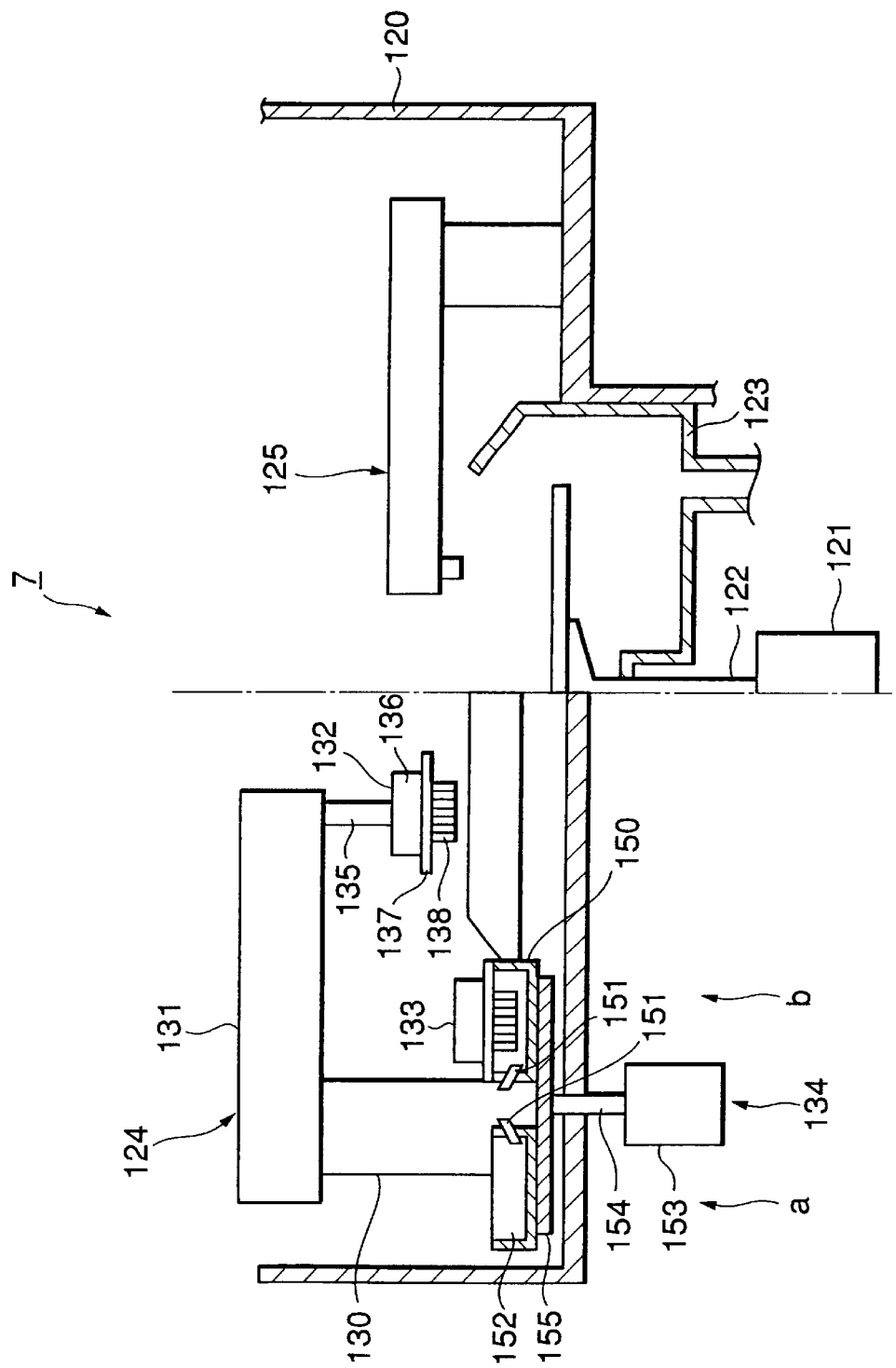
FIG. 10 is a sectional view taken on line A—A in FIG. 9.

The configuration of the surface processing apparatus 7 will be described. FIG. 9 is a plan view of the internal configuration of the surface processing apparatus 7 and FIG. 10 is a sectional view taken on line A-A in FIG. 9. The surface processing apparatus 7 has a case 120, a spin chuck 122 for holding a wafer W in a horizontal position, disposed in a substantially central part of the case 120, a motor 121 for rotating the spin chuck 122, a guard cup 123 surrounding the spin chuck 122 and the wafer W held on the spin chuck 122 to prevent a processing liquid poured over the surface of the wafer W from scattering around, a scrub cleaning device 124 for cleaning the surface of the wafer W held and turned by the spin chuck 122, and a pure water pouring device 125 disposed so that the scrub cleaning device 124 and the pure water pouring device 125 are symmetrical with respect to the spin chuck 122.

Referring to FIG. 10, the scrub cleaning device 124 has an arm 131 fixed in a horizontal position to the upper end of a shaft 130. The shaft 130 is driven for vertical movement and turning by a driving mechanism, not shown. As shown in FIG. 9, the arm 131 is turned in the opposite directions of the arrows Θ over the wafer W by the driving mechanism. In FIG. 9, the arm 131 indicated by continuous lines is located above a peripheral part of the wafer W, and the arm 131' indicated by chain double-dash lines is located at a waiting position apart from the position.

The surface processing apparatus 7 is provided with a first end effector 132 and a second end effector 133, which are the same in construction. The first end effector 132 or the second end effector 133 can selectively be attached to the arm 131. The first end effector 132 is removed from the arm 131 and the second end effector 133 is attached to the arm 131 or the second end effector 133 is removed from the arm 131 and the first end effector 132 is attached to the arm 131 at an end effector changing position a. The first end effector 132 or the second end effector 133 is kept waiting at an end effector keeping position b. A shifting device 134 moves the first end effector 132 and the second end effector 133 between the end effector changing position a and the end effector keeping position b.

FIG. 10 shows a state where the first end effector 132 is held on a free end part of the arm 131 of the scrub cleaning device 124. A spindle 135 capable of being moved vertically and turned by a lifting and turning mechanism, not shown, projects downward from the free end part of the arm 131. The first end effector 132 is attached to a lower end part of the spindle 135. The spindle 135 is moved vertically and turned to move the first end effector 132 vertically and to turn the same. The first end effector 132 has a connecting member 136, a disk 137 attached to the lower end of the connecting member 136, and a cleaning member 138, such as a brush or a sponge pad, attached to the lower surface of the disk 137. A hard brush, such as a nylon brush with hard bristles, or a soft brush with soft bristles, such as a mohair brush, is used selectively as the cleaning member 138 depending on the surface quality of the wafer W. The first end effector 132 is rotated and the cleaning member 138 is brought into contact with the surface of the wafer W to clean the surface of the wafer W.

Figure 11:
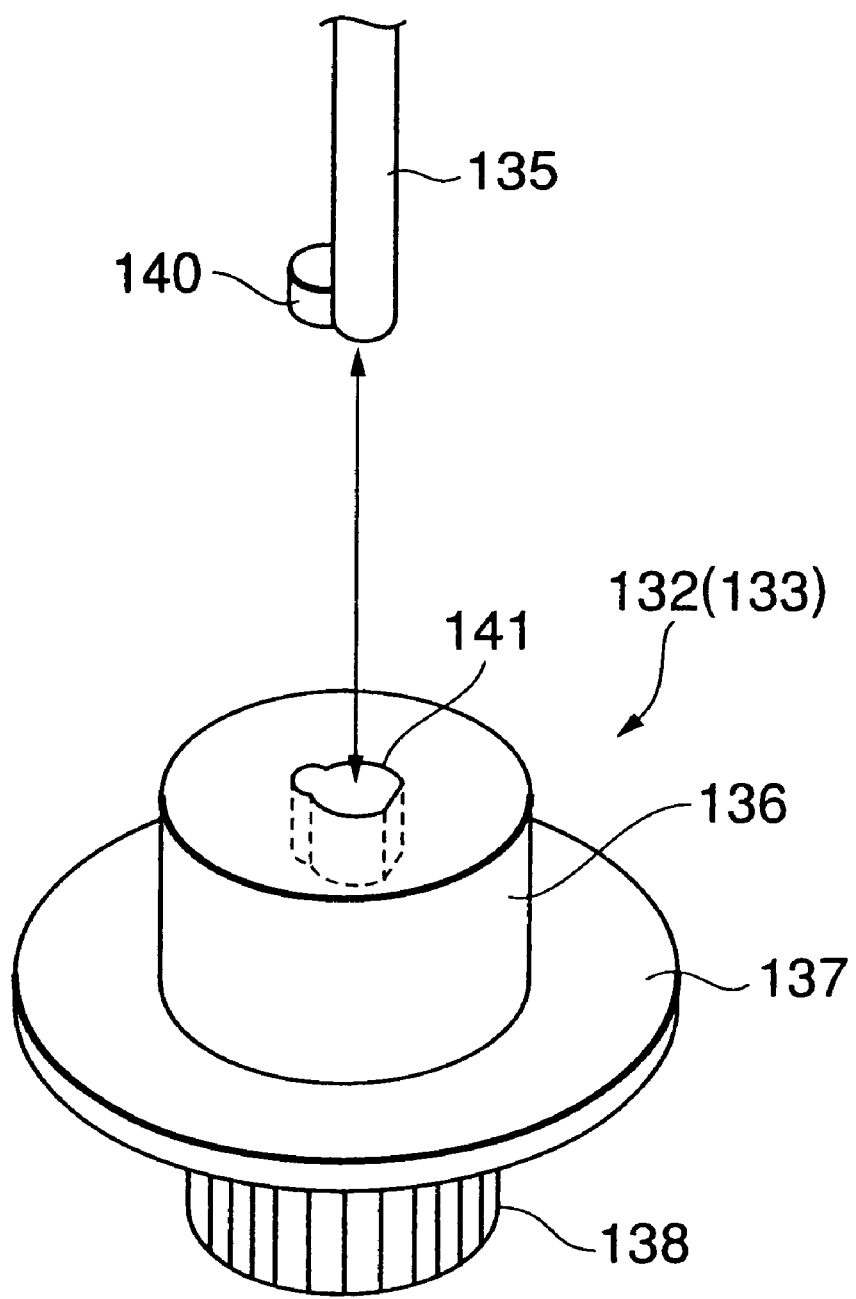
FIG. 11 is a perspective view of a lower end part of a spindle and a first end effector (second end effector)
Figure 12:
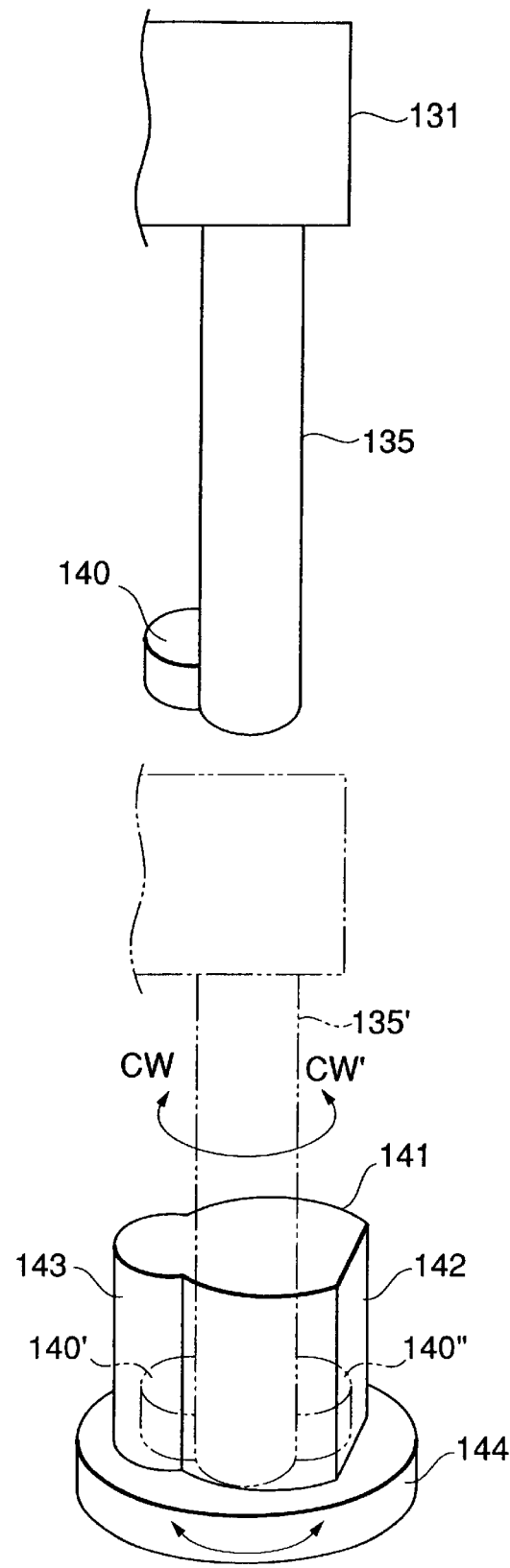
FIG. 12 is a perspective view of assistance in explaining the engagement of a hooking part and a retaining part.

The first end effector 132 can detachably attached to the lower end part of the spindle 135. As shown in FIG. 11, the spindle 135 is proved on its lower end part with a hooking part, 140 and the end effector 132 is provided with a retaining part 141 with which the hooking part 140 is engaged. As shown in FIG. 12, the retaining part 141 is formed by forming a hole 142 in which the spindle 135 is able to move vertically and to turn, and forming a groove 143 in which the hooking part 140 is able to move vertically contiguously with one side of the hole 142. The hole 142 and the groove 143 merge into a circular cavity 144 formed under the same. The circular cavity 144 is stopped on a side opposite to the side of the groove 143 with respect to the hole 142.

The spindle 135 indicated by continuous lines in FIG. 12 is raised to a position above the first end effector 132 and is separated from the first end effector 132. Since the spindle 135 is separated from the first end effector 132, the surface of the wafer W cannot be cleaned. The spindle 135' indicated by chain double-dash lines in FIG. 12 is inserted in the hole 142 of the retaining part 141 of the first end effector 132 by lowering the arm 131. The hooking part 140' indicated by chain double-dash lines in FIG. 12 has been moved through the hole 142 to the bottom of the retaining part 141. The spindle 135' lowered to the bottom of the retaining part 141 is turned in a counterclockwise direction CW', as viewed in FIG. 12, to turn the hooking part 140' in the circular cavity 144 to a position where the hooking part 140 is indicated at 140". The hooking part 140" comes into contact with the side wall of the circular cavity 144 at a position on a side opposite to the side of the groove 143 with respect to the hole 142. Thus, the hooking part 140" and the retaining part 141 are engaged. The hooking part 140" and the retaining part 141 remain firmly engaged when the spindle 135' is turned in the counterclockwise direction CW', as viewed in FIG. 12. During the cleaning process, the first end effector 132 does not come off the spindle 135' and rotates together with the spindle 135'.

The hooking part 140" can simply be disengaged from the retaining part 141 by turning the spindle 135' in a clockwise direction CW, as viewed in FIG. 12, to turn the hooking part 140" to the position of the hooking part 140' (FIG. 12). Then, the arm 131 is moved upward to separate the spindle 135 from the first end effector 132.

Figure 13:
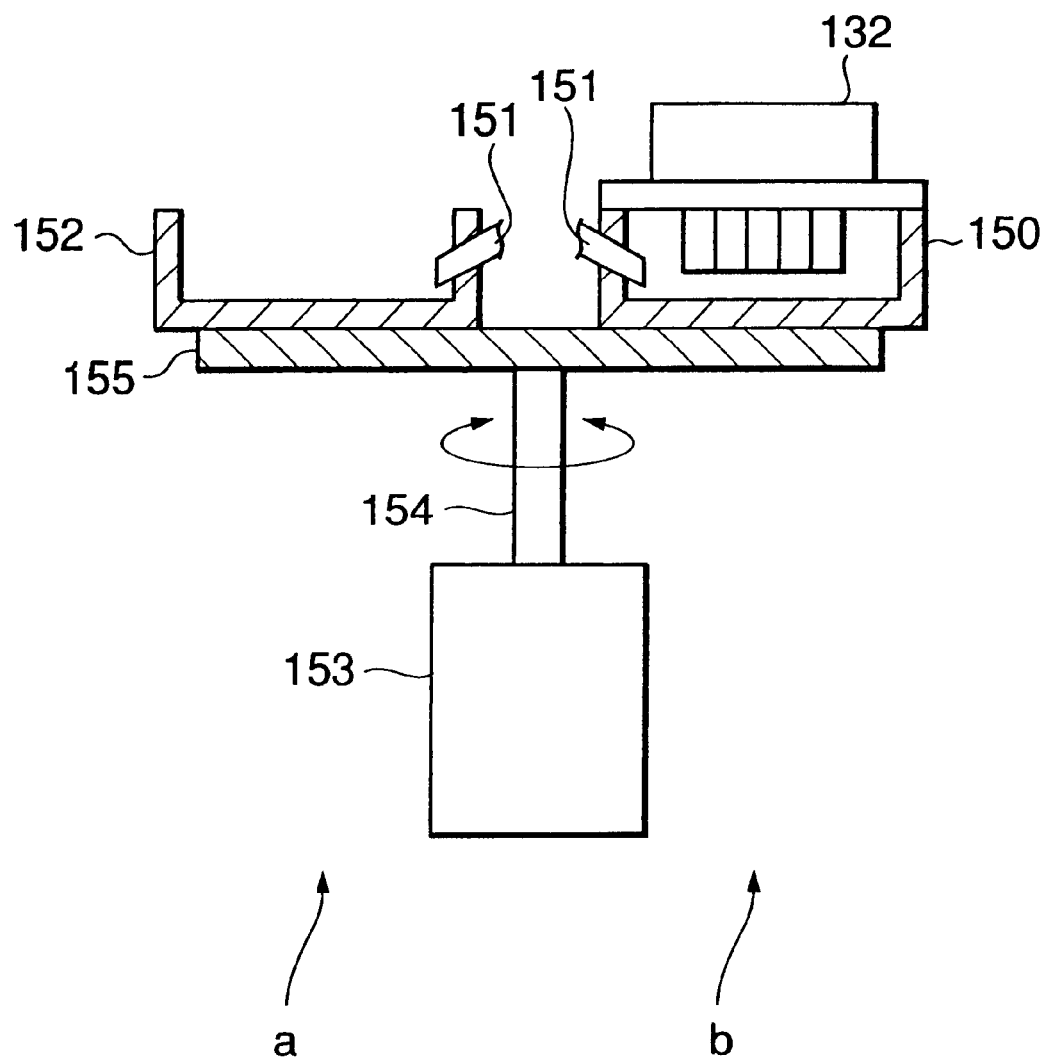
FIG. 13 is a sectional view of an end effector moving device.

As shown in FIGS. 10 and 13, the shifting device 134 waits at the end effector keeping position b with the second end effector 133 supported on a support vessel 150. A pure water pouring pipe 151 is connected to the support vessel 150 to clean the second end effector 133 by pouring pure water as a cleaning liquid over the second end effector 133 while the second end effector 133 is kept at the end effector keeping position b. Pure water supplied into the support vessel 150 is drained through a drain passage, not shown, formed in the bottom of the support vessel 150.

Another support vessel 152 similar in construction to the support vessel 150 is located at the end effector changing position a. The support vessels 150 and 152 are mounted on the top surface of a turning table 155 connected to the output shaft 154 of a motor 153. The turning table 155 of the shifting device 134 is turned by the motor 153 to make the support vessels 150 and 152 interchange their positions; the support vessel 150 is shifted from the end effector keeping position b to the end effector changing position a, and the support vessel 152 is shifted from the end effector changing position a to the end effector keeping position b.

In FIG. 10, the first end effector 132 is used by the scrub cleaning device 124 for cleaning the surface of the wafer W, and the second end effector 133 is kept at the end effector keeping position b. The second end effector 133 can be attached to the arm 131 to use the same by the scrub cleaning device 124 for cleaning the surface of the wafer W, and the first end effector 132 can be kept at the end effector keeping position b.

The pure water pouring device 125 can be turned in the opposite directions of the arrows θ' (FIG. 9). The surface processing apparatus 7 powers pure water over the surface of the wafer W by the pure water pouring device 125 during the cleaning process.

The wafer processing operation of the cleaning system 1 provided with the surface processing apparatus 7 will be described below. A carrying robot, not shown, carries a carrier C containing, for example, twenty-five wafers W to be cleaned to the table 2. The wafers W are taken out from the carrier C one at a time, and the wafer is transferred to the carriage 4 by the wafer handling device 3. The surface processing apparatuses 7 and 8 clean the wafers W one by one to remove organic contaminants and particles from the wafers W. The wafers W thus cleaned are heated and dried by the heating device 9. Then, the wafers W are transferred from the carriage 4 to the wafer handling device 3. The wafer handling device 3 returns the cleaned wafers W into the carrier C.

Figure 14:
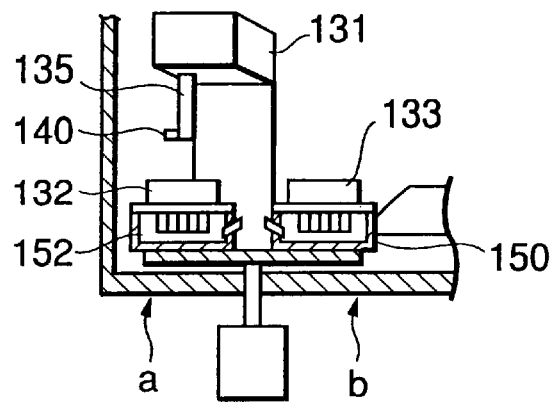
FIG. 14 is a schematic sectional view of a first end effector in a state immediately before being attached to an arm.

The cleaning process to be carried out by the surface processing apparatus 7 will be described in connection with a procedure for alternately using the first end effector 132 and the second end effector 133 FIGS. 14 to 19). The cleaning process has a first cleaning process, such as a precleaning process, and a second cleaning process, such as a finishing cleaning process. Referring to FIG. 14 showing the first end effector 132 and the second end effector 133 set in an initial state, the first end effector 132 is mounted on the support vessel 152 at the end effector changing position a, and the second end effector 133 is mounted on the support vessel 153 at the end effector keeping position b. The arm 131 is turned to locate the spindle 135 above the first end effector 132 kept at the end effector changing position a.

Figure 15:
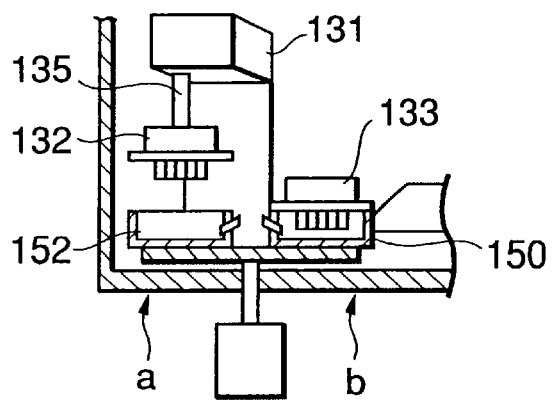
FIG. 15 is a schematic sectional view of the first end effector in a state immediately after being attached to the arm.

As shown in FIGS. 11 and 12, the spindle 135 is moved downward to insert the hooking part 140 into the bottom of the retaining part 141, and then the spindle 135 is turned in the counterclockwise direction CW', as viewed in FIG. 12, to engage the hooking part 140 and the retaining part 141 firmly. As shown in FIG. 15, the spindle 135 is raised to lift up the first end effector 132 from the support vessel 152. Then, the arm 131 is turned in the direction of the arrow 6 to move the first end effector 132 to a predetermined position above the wafer W, such as a position above the center of the wafer W as shown in FIG. 9.

The spindle 135 moved downward while the same is rotated together with the first end effector 132 in the counterclockwise direction CW', as viewed in FIG. 12, to bring the first end effector 132 into contact with the surface of the wafer W. During the cleaning process, the first end effector 122 is not removed from the spindle 135. The arm 131 is turned at least once to move the first end effector 132 at least once from the central part of the wafer W to the peripheral part of the same to clean the surface of the wafer W uniformly. Thus, the first end effector 132 is used for the first cleaning process, such as a precleaning process, to clear the surface of the wafer W of particles and such adhering thereto. The pure water pouring device 125 is moved to a position above the wafer W and pours pure water over the surface of the wafer W to wash particles off the surface of the wafer W. If the surface condition of the wafer W requires, the first end effector 132 in contact with the surface of the wafer W may be driven for oscillation instead of rotation to clean the surface of the wafer W by a scrub cleaning process.

Figure 16:
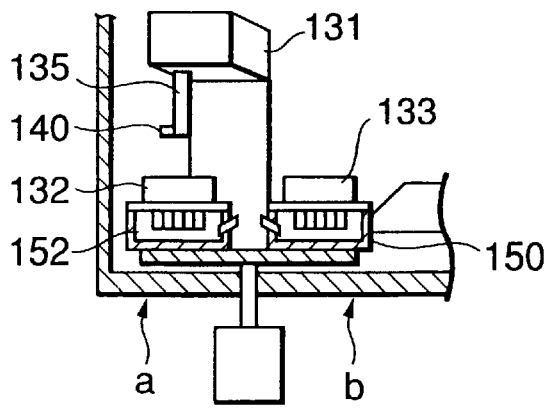
FIG. 16 is a schematic sectional view of the first end effector in a state immediately after being removed from the arm.

In the second stage of the cleaning process, i.e., a stage for the second cleaning process, such as a finishing cleaning process, the first end effector 132 is replaced with the second end effector 133. The arm 131 is turned to locate the first end effector 132 above the support vessel 152 positioned at the end effector changing position a as shown in FIG. 15. Subsequently, the spindle 135 is moved downward to mount first end effector 132 on the support vessel 152, is turned in the clockwise direction CW, as viewed in FIG. 12, to disengage the hooking part 140 from the retaining 141. Then, as shown in FIG. 16, the spindle 135 is raised to separate the hooking part 140 from the retaining part 141 and to remove the spindle 135 from the first end effector 132. Thus, the arm 131 is capable of easily achieving operations for attaching the first end effector 132 (the second end effector 133) to and removing the same from the spindle 135.

Figure 18:
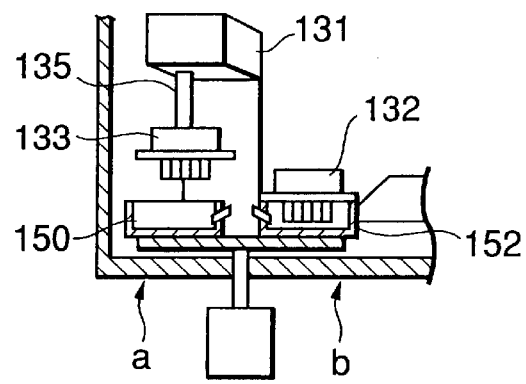
FIG. 18 is a schematic sectional view of the second end effector in a state immediately after being attached to the arm.

Then, the turning table 155 is turned to shift the support vessel 152 supporting the first end effector 132 from the end effector changing position a to the end effector keeping position b, and to shift the support vessel 150 supporting the second end effector 133 from the end effector keeping position b to the end effector changing position a. Subsequently, the same operation as that for attaching the first end effector 132 to the spindle 135 is performed to attach the second end effector 133 to the spindle 135 and to take up the same from the support vessel 150. As shown in FIG. 18.

As shown in FIG. 9, the arm 131 is turned in the direction of the arrow θ toward the wafer W, the same operation as that carried out with the first end effector 132 is carried out, and the arm 131 is turned at least once to move the first end effector 132 at least once from the central part of the wafer W to the peripheral part of the same to clean the surface of the wafer W uniformly. Particles adhered to the first end effector 132 during the first cleaning process are not transferred to the second cleaning process. The second end effector 133 free of particles is used for the second cleaning process. Thus, the first end effector 132 and the second end effector 133 are used for the first and the second cleaning process, respectively, to improve the cleaning effect of the cleaning process.

Figure 17:
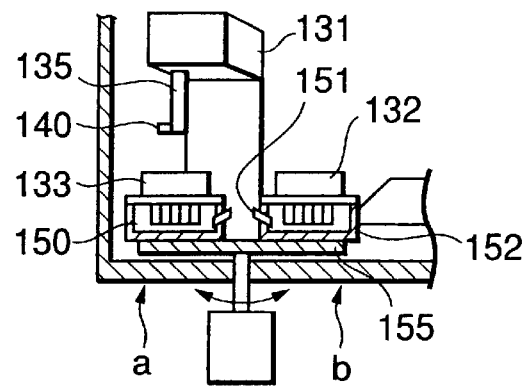
FIG. 17 is a schematic sectional view of a second end effector in a state immediately before being attached to the arm.

As shown in FIG. 17, pure water is poured through the pure water pouring pipe 151 over the first end effector 132 kept at the end effector keeping position b to wash off particles adhered thereto in the first cleaning process and to clean the first end effector 132 during the second cleaning process using the second end effector 133.

Figure 19:
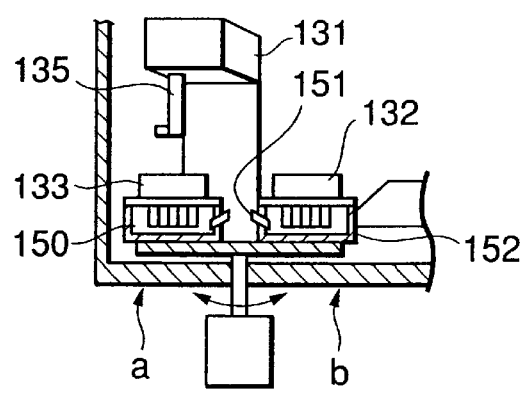
FIG. 19 is a schematic sectional view of the second end effector in a state immediately after being removed from the arm.

After the completion of the cleaning process, the arm 131 is turned to move the second end effector 133 away from the wafer W and to position the same above the support vessel 150 positioned at the end effector changing position a as shown in FIG. 18. Then, the second end effector 133 is removed from the spindle 135 as shown in FIG. 19. The turning table 155 is turned to shift the supporting member 150 supporting the second end effector 133 thereon from the end effector changing position a to the end effector keeping position b. Consequently, the supporting member 152 supporting the first end effector 132 is shifted from the end effector keeping position b to the end effector changing position a. Pure water is poured through the pure water pouring pipe 151 over the second end effector 133 kept at the end effector keeping position b to clean the second end effector 133. Thus, the first end effector 132 and the second end effector 133 are set in the initial state shown in FIG. 14.

The spin chuck 122 is rotated at a high rotating speed to scatter the processing liquid wetting the wafer W to dry the wafer W. The cleaned and dried wafers W are taken away from the surface processing apparatus 7 and new wafers W are supplied successively to the surface processing apparatus 7. The steps shown in FIGS. 14 to 19 are repeated to carry out the cleaning process continuously. The processed wafers are returned to the carrier C, and the carrier C containing the twenty-five processed wafers W is delivered from the cleaning system 1.

Thus, the first end effector 132 and the second end effector 133 are used for the first and the second cleaning process, respectively, to improve the cleaning effect of the cleaning process.

Figure 20:
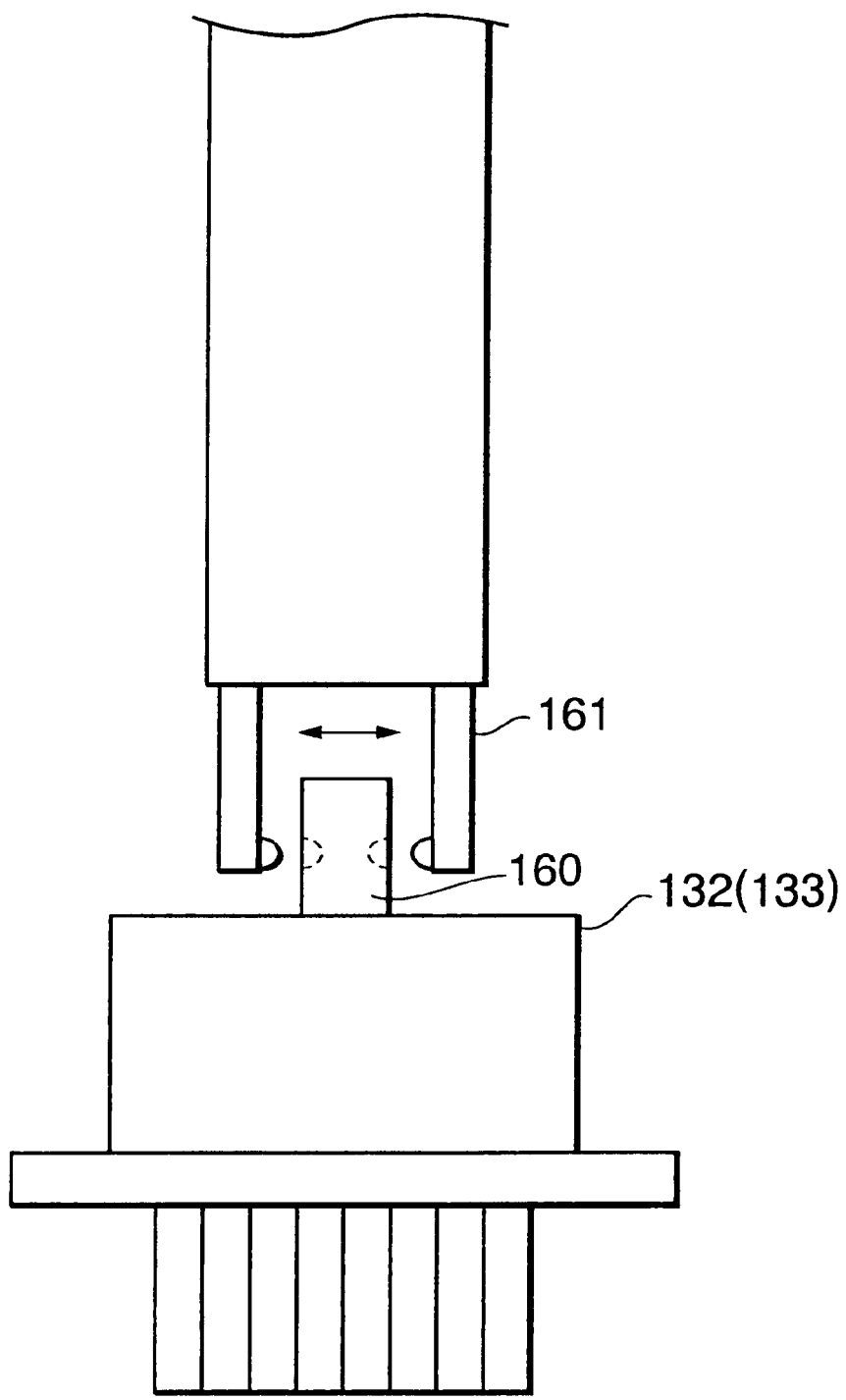
FIG. 20 is a side elevation of a first end effector (second end effector) provided on its upper part with a projection, and a spindle provided on its lower end part with a chuck.

Although the invention has been described in connection with the preferred embodiment thereof, the present invention is not limited thereto in its practical application and various modifications thereof are possible. For example, the first end effector 132 (the second end effector 133) may be provided with a projection 160 on its upper part, and the spindle 135 may be provided at is lower end with a chuck 161 for gripping the projection 160 as shown in FIG. 20. The combination of the projection 160 and the chuck 161, similarly to the combination of the hooking part 140 and the retaining part 141, facilitates operations of the arm 131 for holding and releasing the first end effector 132 (the second end effector 133).

Figure 21:
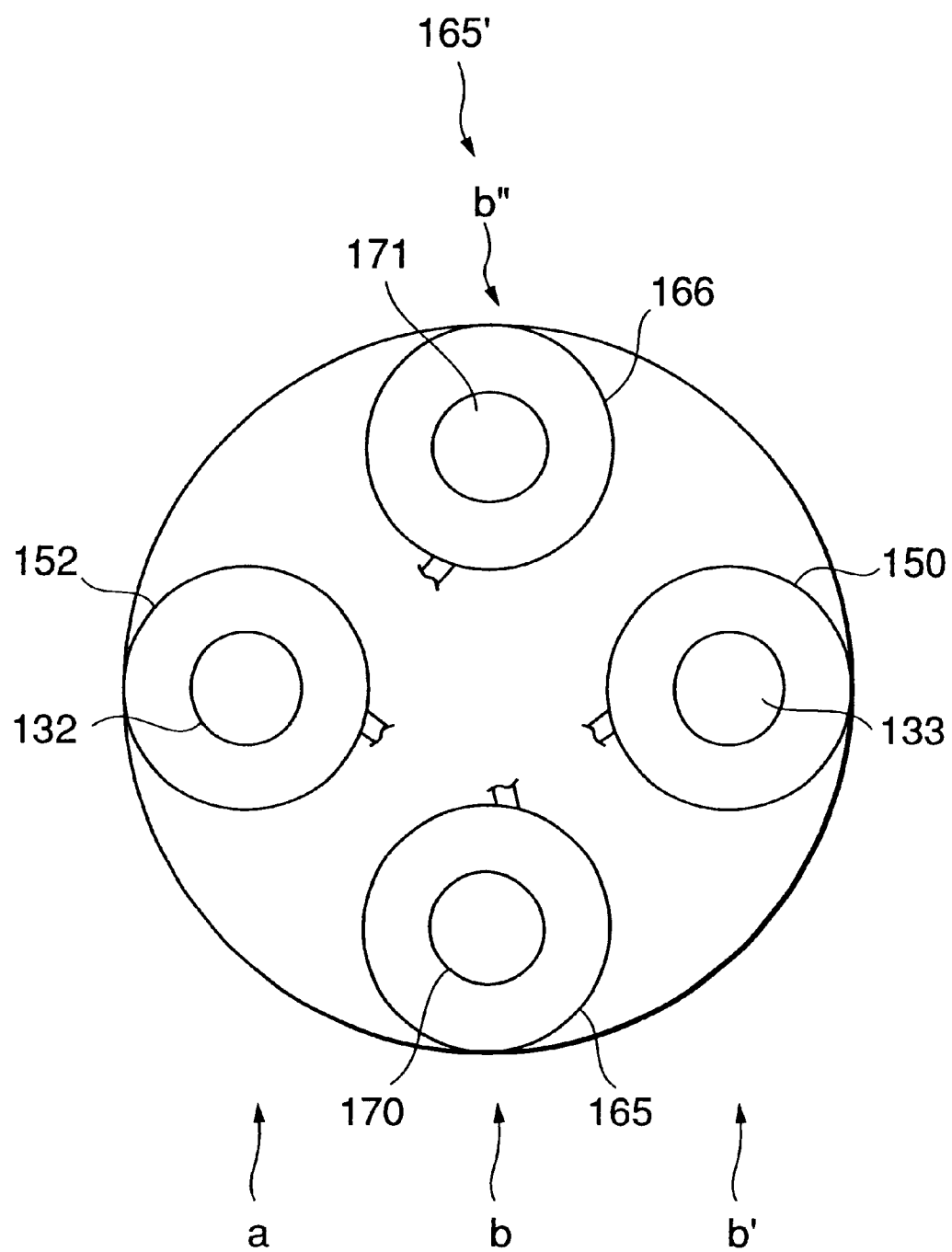
FIG. 21 is an enlarged plan view of a rotatable turning table included in a surface processing apparatus and having a large support surface capable of supporting a plurality of end effectors thereon.

The surface processing apparatus 7 may be provided with a turning table 165' capable of supporting more than two end effectors, as shown in FIG. 21. The support surface of the turning table 165' shown in FIG. 21 is divided into quadrants, and support vessels 150, 152, 165 and 166 are disposed in the quadrants, respectively. A first end effector 132, a second end effector 133, a third end effector 170 and a fourth end effector 171 are mounted on the support vessels 15, 150, 165 and 166, respectively. In a state shown in FIG. 21, the support vessels 152, 165, 150 and 166 are at an end effector changing position a, and at end effector keeping positions b, b' and b", respectively. The end effectors are used respectively for a first cleaning process for a precleaning process, a second cleaning process for a first intermediate cleaning process, a third cleaning process for a second intermediate cleaning process and a fourth cleaning process for a finishing cleaning process, which further improves the cleaning effect of the cleaning process.

The surface processing apparatus 7 provided with this turning table 165' may use the combination of the first end effector 132 and the second end effector 133 for cleaning the surfaces of wafers W for a predetermined period of use, and may use the combination of the third end effector 170 and the fourth end effector 171 for another predetermined period of use. First, the combination of the first end effector 132 and the second end effector 133 is used for cleaning the surfaces of wafers W. When the first end effector 132 and the second end effector 133 are worn or deformed, the combination of the third end effector 170 and the fourth end effector 171 is used for cleaning the surfaces of wafers W. When all the end effectors 132, 133, 170 and 171 have been worn or deformed, the end effectors 132, 133, 170 and 171 are removed from the turning table 165', to replace the same with four new end effectors. The prior art surface processing apparatus is provided with only a single end effector and hence needs to carry out maintenance work every time the end effector is worn or deformed. The surface processing apparatus 7 according to the present invention needs to carry out maintenance work at a period of maintenance cycle twice as long as that at which the prior art surface processing apparatus needs to carry out maintenance work. The turning table 165' may be designed to support more than four end effectors thereon to extend the period of maintenance cycle to three or four times the period at which the prior art surface processing apparatus needs maintenance work. The end effectors may be replaced with new ones after the same have been used, for example, for three month or after the same have been used for cleaning, for example, 10,000 wafers W.

One of the first end effector 132, the second end effector 133, the third end effector 170 and the fourth end effector 171 of the surface processing apparatus 7 provided with the turning table 165' may selectively be used for the optimum processing of the surface of a wafer W depending on the quality of the surface of the wafer W. For example, the first end effector 132 and the second end effector 133 are used for a first cleaning process and a second cleaning process if an oxide film is formed over the surface of the wafer W, and the third end effector 170 and the fourth end effector 171 are used for a first cleaning process and a second cleaning process if a polysilicon film is formed over the surface of the wafer. The turning table 165' may be designed to support more than four end effectors to enable the surface processing apparatus 7 to clean many kinds of films including aluminum films and nitride films. Since the surface processing apparatus 7 can be applied to processing wafers provided respectively with many kinds of films, footprint can be saved.

Substrates need not be limited to semiconductor wafers mentioned in the foregoing description, but may be substrates for LCDs, glass substrates, substrates for CDs, photomasks, printed wiring boards or ceramic substrates.

Accordingly, the end effector can easily be replaced with another one suitable for intended object and use, and hence the redeposition of once removed particles on the substrate can be prevented to improve the effect of the process. Since the surface processing apparatus is provided with a plurality of end effectors, the surface processing apparatus needs maintenance work at an extended period of maintenance cycle. Since the surface processing apparatus is capable of processing substrates respectively provided with different kinds of films, footprint can be saved. Accordingly, process for fabricating a device, such as a semiconductor device, can be facilitated and productivity can be improved.

What is claimed is:

1. A processing apparatus for processing substrates, comprising:

a holding means for holding a substrate;

an end effector to be brought into contact with a surface of the substrate held by the holding means to process the surface, said end effector being capable of being retracted to a waiting position apart from the surface of the substrate;

a measuring means for measuring contract pressure applied by the retracted end effector in the waiting position, wherein the measuring means comprises a table on which the end effector is placed, and a measuring mechanism capable of sensing and measuring a contact pressure applied to the table to determine a contact pressure applied by the end effector, and wherein the table is disposed with its support surface on the level of the surface of the substrate held by the holding means.

2. The processing apparatus according to claim 1 further comprising:

a processing liquid supplying means for supplying a processing liquid over the substrate held by the holding means, and a processing liquid discharge mechanism for discharging processing liquid onto the table.

3. The processing apparatus according to claim 1 further comprising a cleaning means for cleaning the end effector, disposed at the waiting position.

4. The processing apparatus according to claim 3, wherein the cleaning means comprises:

a supporting member for supporting the end effector thereon, and a cleaning liquid supplying mechanism for supplying a cleaning liquid.

5. The processing apparatus according to claim 3, wherein the cleaning means and the measuring means are disposed close to each other.

6. The processing apparatus according to claim 1 further comprising:

an end effector support member for supporting end effectors, and plurality of end effectors similar to said end effector and capable of being supported on the end effector support member.

7. The processing apparatus according to claim 6, wherein first and second end effectors are used, and the first and the second end effector can alternately be supported on the end effector support member.

8. The processing apparatus according to claim 1 further comprising means for comparing a measured effector contact pressure against a permissible range of pressure values to determine whether the measured effector contact pressure is within or outside the permissible range.

9. The processing apparatus according to claim 8 further comprising means for adjusting contact pressure of the effector upon a determination of the measured contact pressure being outside the permissible range to place the contact pressure within the permissible range.

10. A processing method of processing a surface of a substrate held by a holding means by bringing an end effector into contact with the surface of the substrate comprising:

moving the end effector away from a position above the substrate to a waiting position; and measuring contact pressure to be applied by the end effector to the substrate during a process for processing the substrate and/or during a period in which the substrate held by the holding means is removed from the holding means and carried away, and another substrate is held by the holding means for processing, wherein said measuring contact pressure includes placing the end effector on a contact table and measuring a contact pressure applied to the contact table by the end effector.

11. The processing method according to claim 10 wherein said measuring contact pressure includes placing the end effector on a contact table that is disposed with a support surface on the level of the surface of the substrate held by the holding means.

12. The processing method according to claim 10 wherein liquid is directed at the effector while measuring the contact pressure applied to the contact table by the end effector.

13. The processing method according to claim 10 further comprising comparing a measured effector contact pressure against a permissible range of pressure values to determine whether the measured effector contact pressure is within or outside the permissible range.

14. The process method according to claim 13 further comprising adjusting contact pressure of the effector upon a determination of the measured contact pressure being outside the permissible range to place the contact pressure within the permissible range.

15. The processing method according to claim 10, wherein the end effector is moved away from the position above the substrate and cleaned during a process for processing the substrate and/or during a period in which the substrate held by the holding means is removed from the holding means and carried away, and another substrate is held by the holding means for processing.

16. The processing method according to claim 10, wherein a plurality of end effectors are kept in reserve, and the end effector is changed periodically.

17. The processing method according to claim 10, wherein there are a plurality of different end effectors, and the end effectors are used selectively for surface processing according to the surface condition of the substrate.

18. The processing method according to claim 10, wherein first and second end effectors are used for processing a substrate by a first process and a second process, respectively.

* * * * *